United States Patent
Chang et al.

(10) Patent No.: US 11,410,876 B2
(45) Date of Patent: Aug. 9, 2022

(54) SEMICONDUCTOR DEVICE WITH AIR GAPS AND METHOD OF FABRICATION THEREOF

(71) Applicant: Taiwan Semiconductor Manufacturing Co., Ltd., Hsin-Chu (TW)

(72) Inventors: Chia-Hao Chang, Hsinchu (TW); Lin-Yu Huang, Hsinchu (TW); Li-Zhen Yu, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 17/090,028

(22) Filed: Nov. 5, 2020

(65) Prior Publication Data
US 2021/0375664 A1 Dec. 2, 2021

Related U.S. Application Data

(60) Provisional application No. 63/031,281, filed on May 28, 2020.

(51) Int. Cl.
*H01L 21/768* (2006.01)
*H01L 29/417* (2006.01)
(Continued)

(52) U.S. Cl.
CPC .......... *H01L 21/7682* (2013.01); *H01L 21/76* (2013.01); *H01L 21/76834* (2013.01);
(Continued)

(58) Field of Classification Search
CPC ........... H01L 21/7682; H01L 21/76834; H01L 21/76; H01L 29/42392; H01L 29/78696;
(Continued)

(56) References Cited

U.S. PATENT DOCUMENTS 8,785,285 B2   7/2014 Tsai et al.
8,772,109 B2   8/2014 Colinge
(Continued)

*Primary Examiner* — Joseph C. Nicely
(74) *Attorney, Agent, or Firm* — Haynes and Boone, LLP

(57) ABSTRACT

A method includes providing a structure having a substrate, a first dielectric layer over the substrate, one or more semiconductor channel layers over the first dielectric layer and connecting a first source/drain (S/D) feature and a second S/D feature, and a gate structure engaging the one or more semiconductor channel layers; etching the substrate from the backside of the structure to form a first trench exposing the first S/D feature and a second trench exposing the second S/D feature; forming an S/D contact in the first trench; etching at least a portion of the first dielectric layer resulting in a portion of the S/D contact protruding from the first dielectric layer at the backside of the structure; and depositing a seal layer over the S/D contact, wherein the seal layer caps an air gap between the gate structure and the seal layer.

20 Claims, 33 Drawing Sheets

(51) Int. Cl.
*H01L 23/528* (2006.01)
*H01L 23/532* (2006.01)
*H01L 21/76* (2006.01)
*H01L 29/423* (2006.01)
*H01L 29/786* (2006.01)
*H01L 29/40* (2006.01)
*H01L 29/06* (2006.01)
*H01L 21/02* (2006.01)

(52) U.S. Cl.
CPC .... *H01L 23/5286* (2013.01); *H01L 23/53295* (2013.01); *H01L 29/401* (2013.01); *H01L 29/41791* (2013.01); *H01L 29/42392* (2013.01); *H01L 29/78696* (2013.01); *H01L 21/02172* (2013.01); *H01L 21/02274* (2013.01); *H01L 29/0673* (2013.01)

(58) Field of Classification Search
CPC ........... H01L 29/41791; H01L 29/0673; H01L 29/66787
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2021/0336012 A1* | 10/2021 | Huang ................. H01L 29/785 |

* cited by examiner

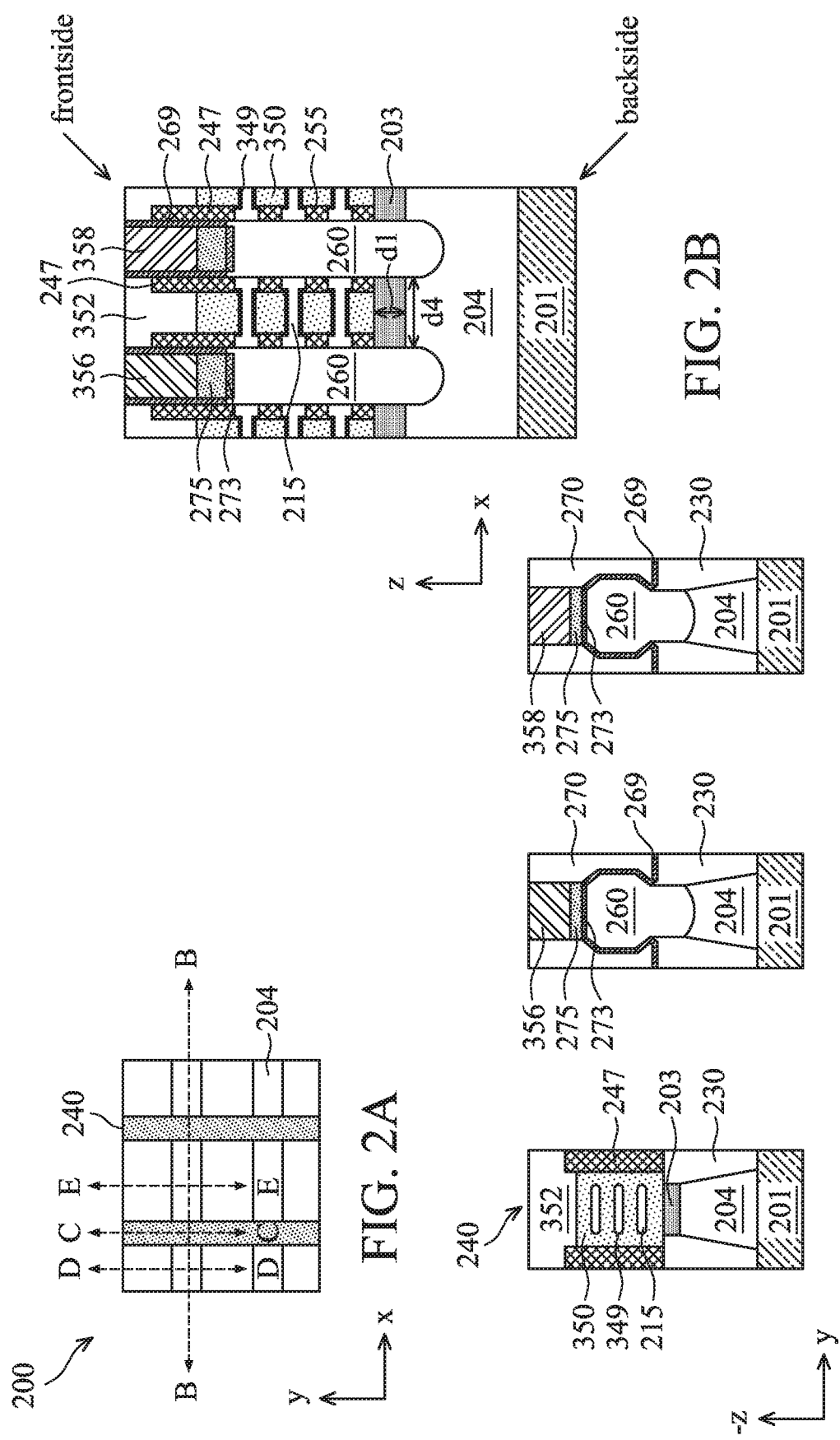

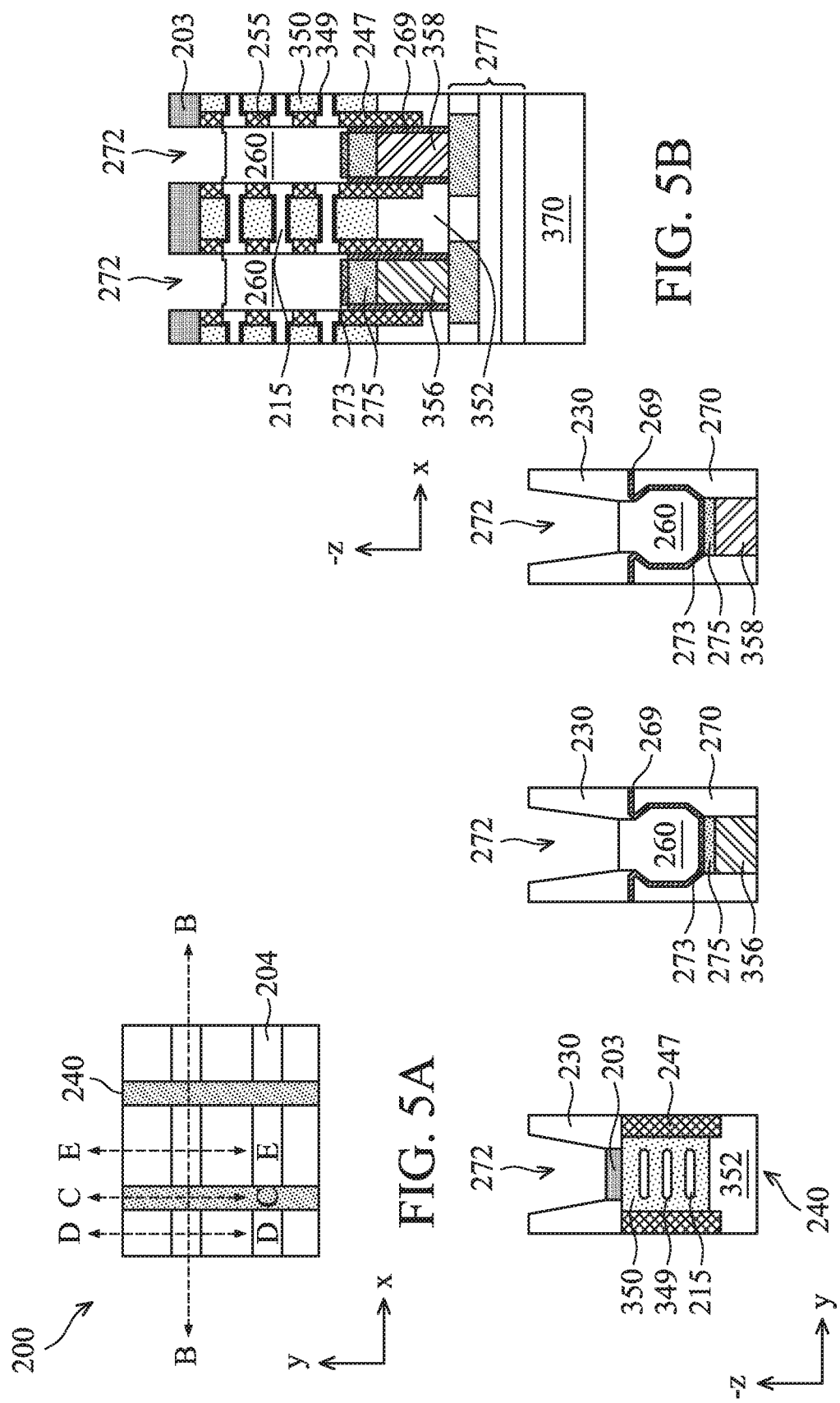

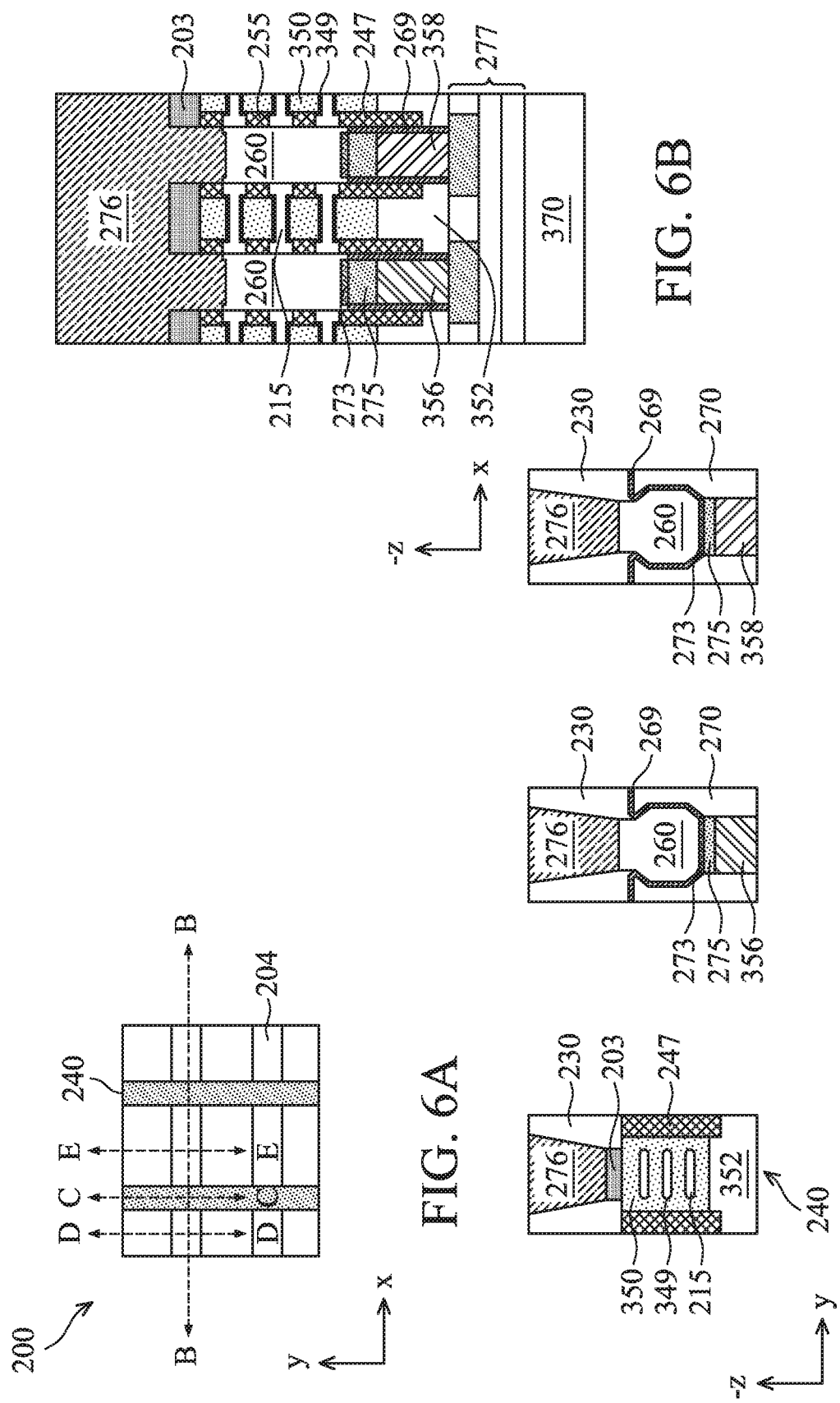

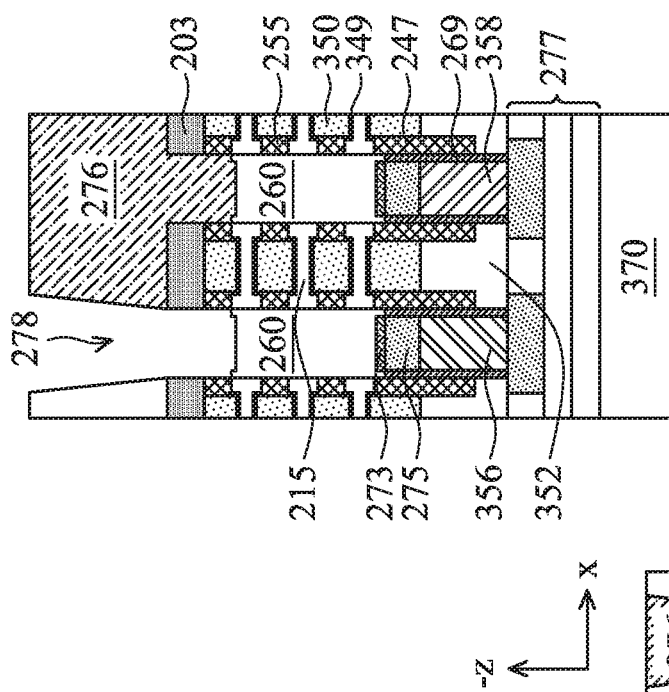
FIG. 8B
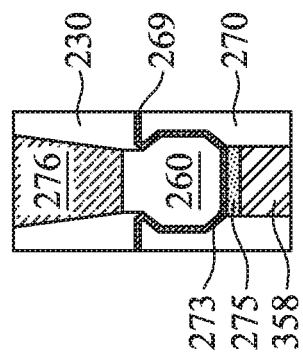
FIG. 8E
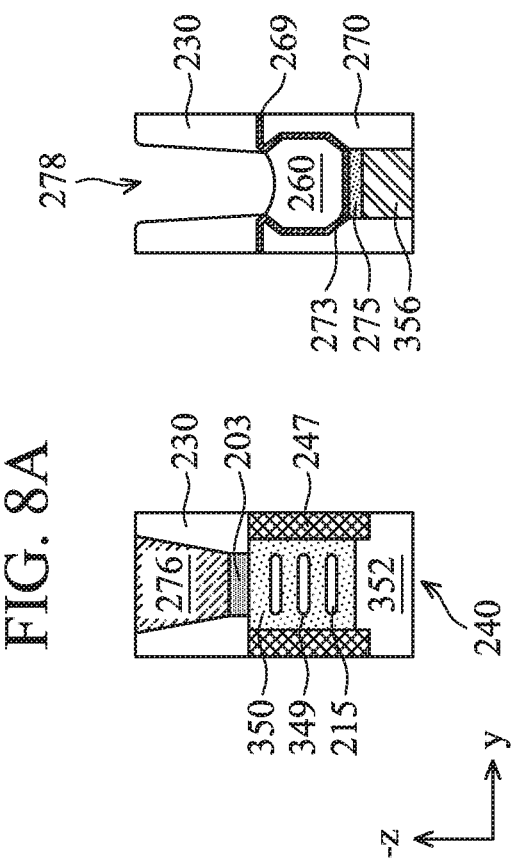
FIG. 8D
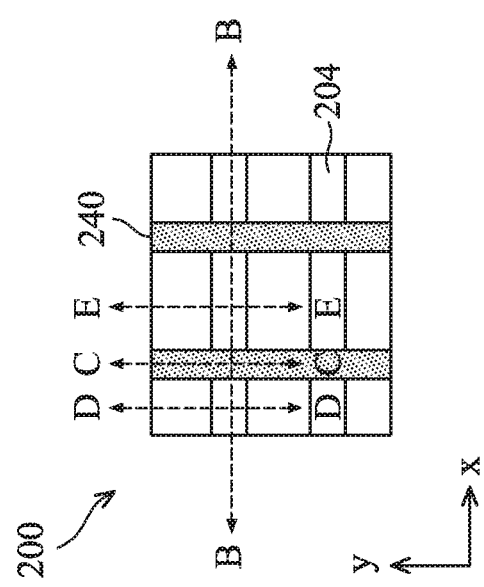
FIG. 8A
FIG. 8C

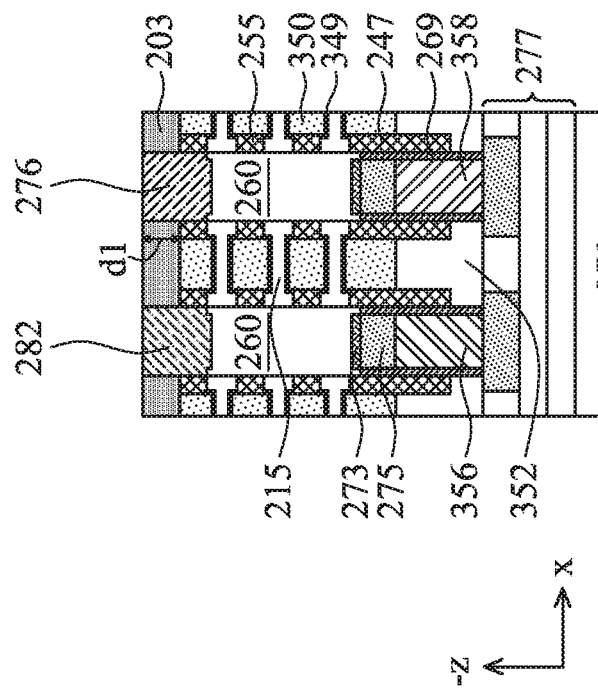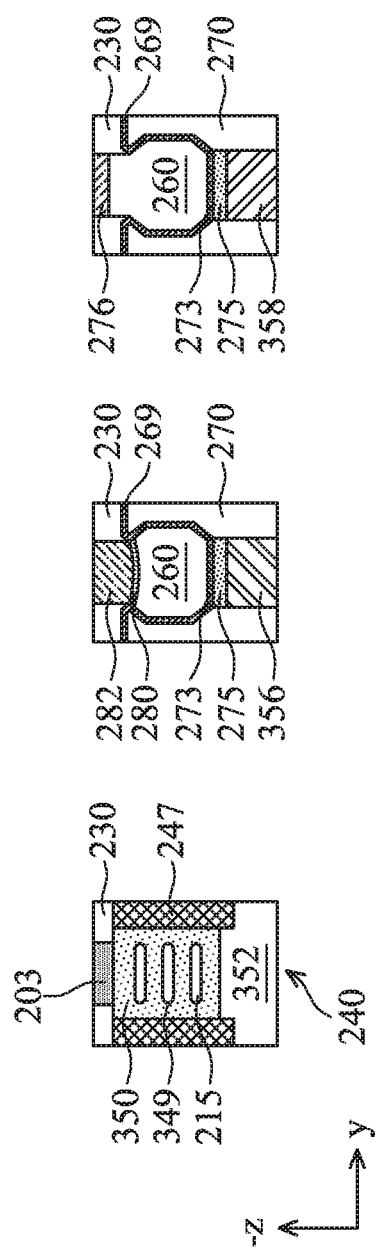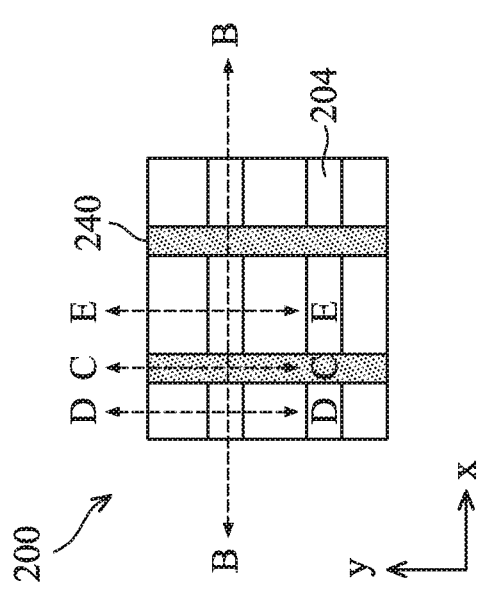
FIG. 9A
FIG. 9B
FIG. 9C
FIG. 9D
FIG. 9E

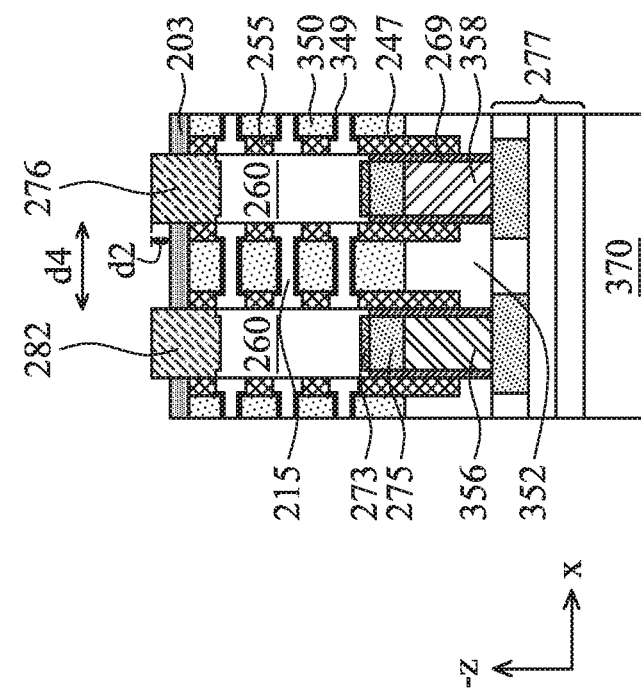
FIG. 10B
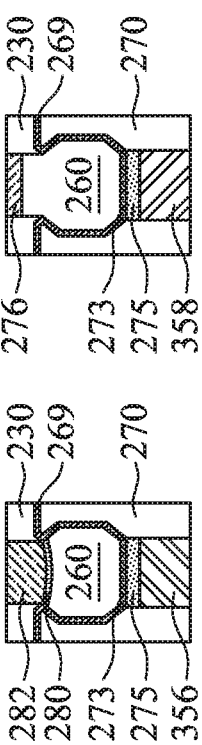
FIG. 10E
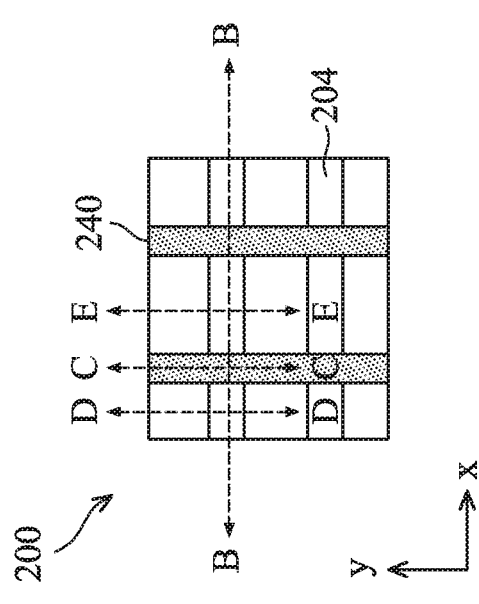
FIG. 10A
FIG. 10D
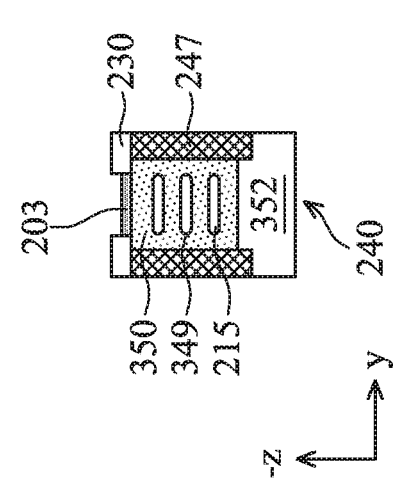
FIG. 10C

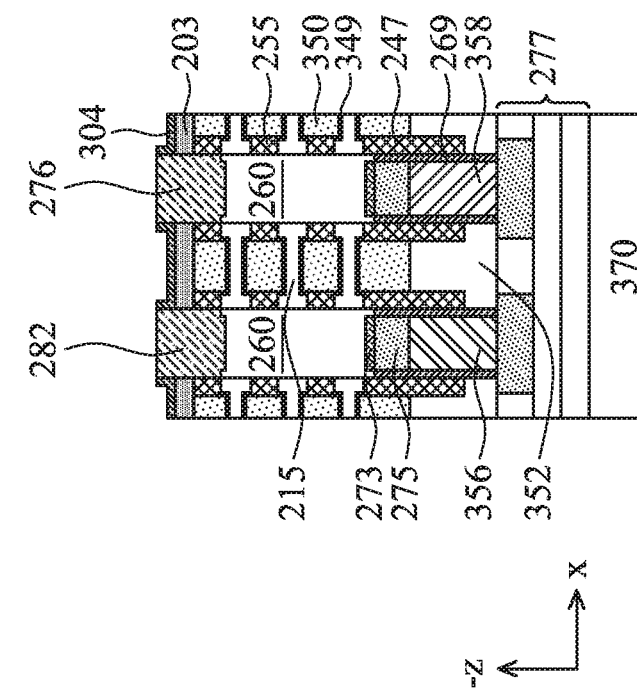
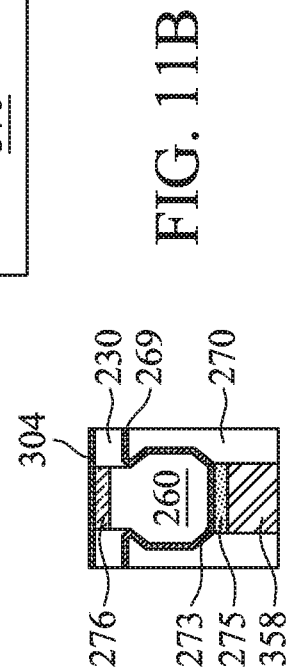
FIG. 11B
FIG. 11E
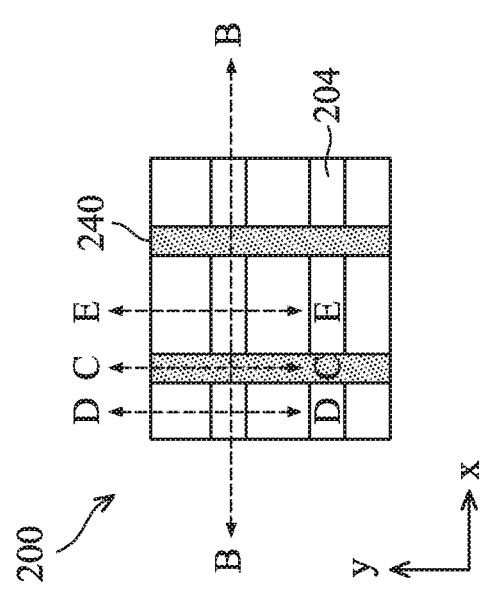
FIG. 11A
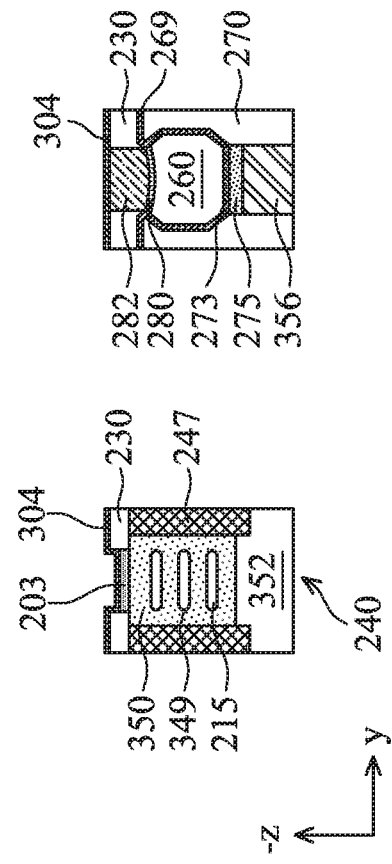
FIG. 11D
FIG. 11C

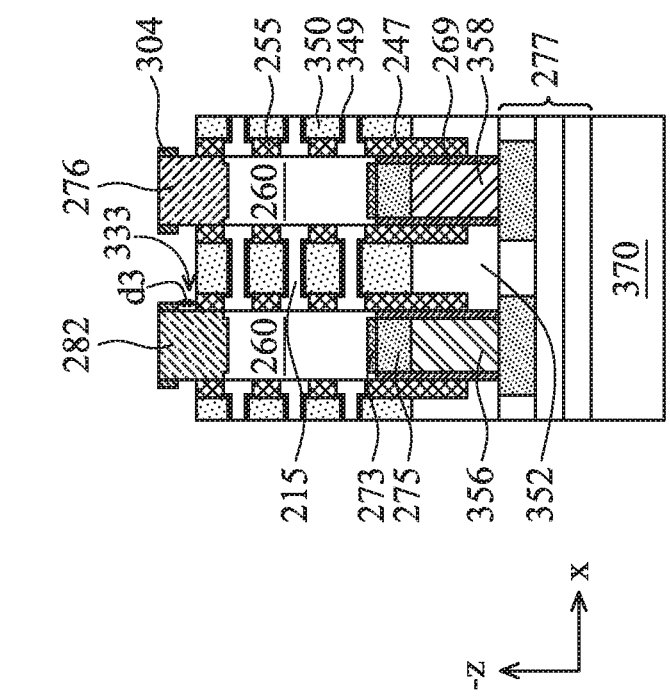
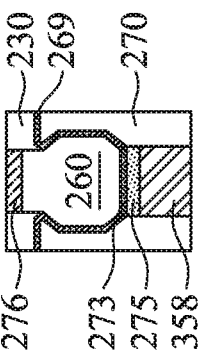
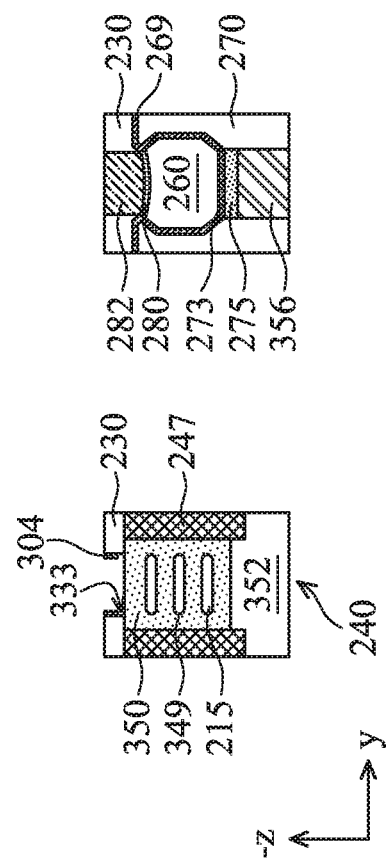
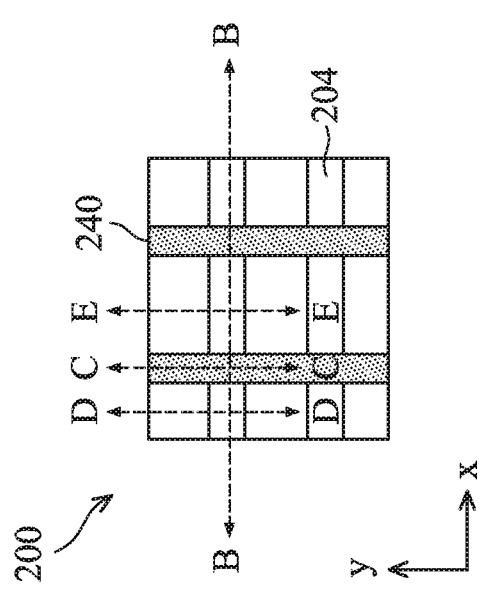
FIG. 13A  FIG. 13B  FIG. 13C  FIG. 13D  FIG. 13E

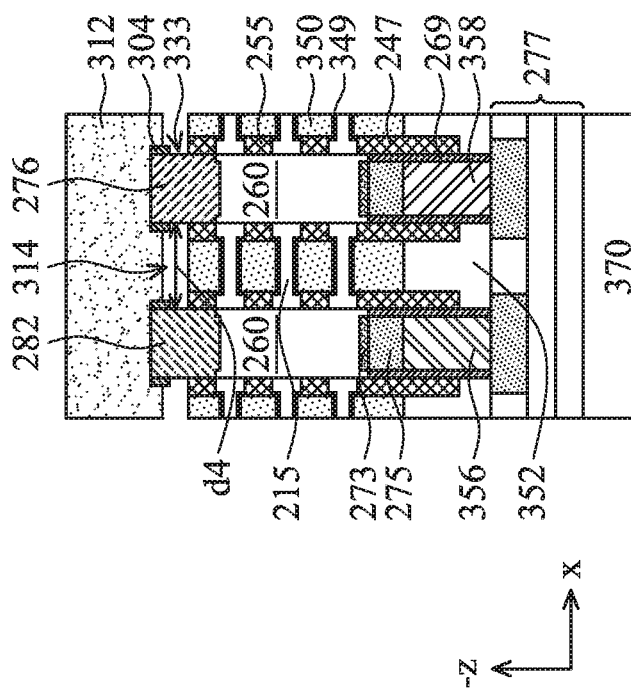
FIG. 14B
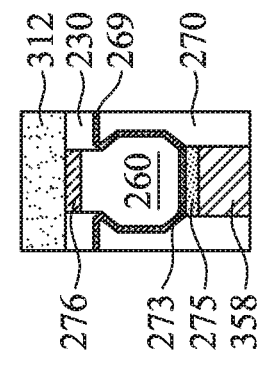
FIG. 14E
FIG. 14D
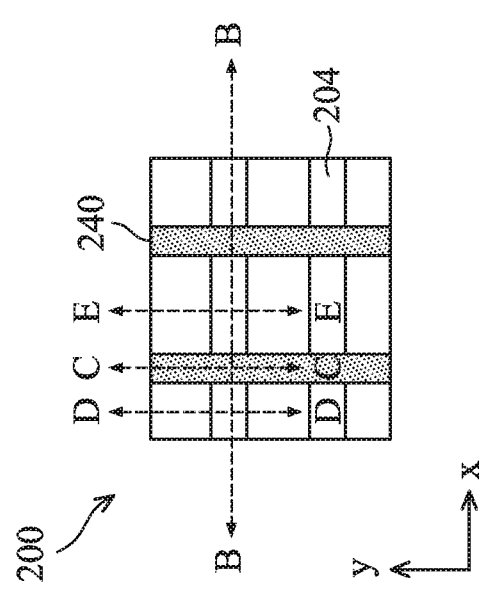
FIG. 14A
FIG. 14C
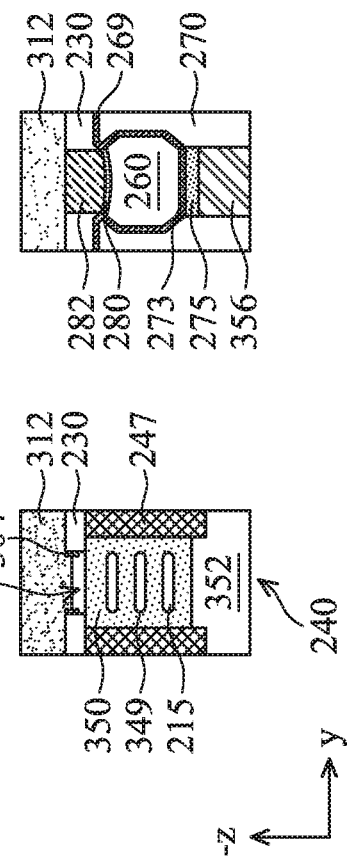

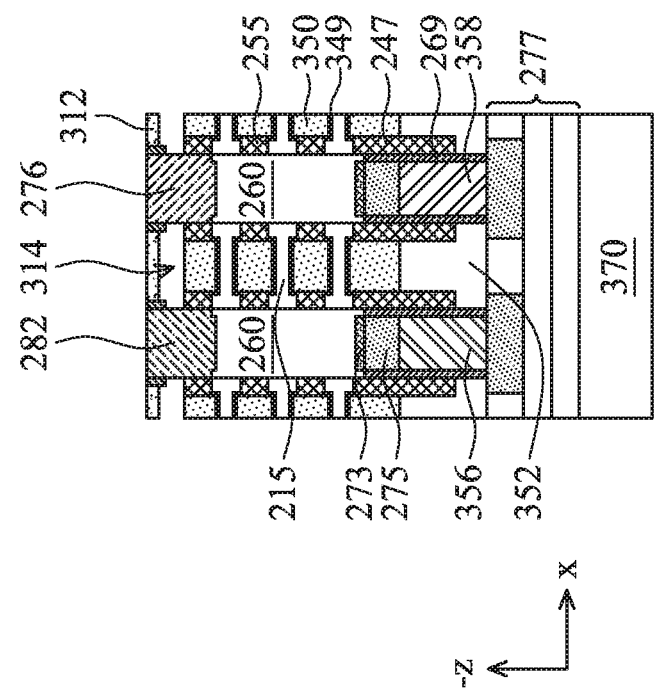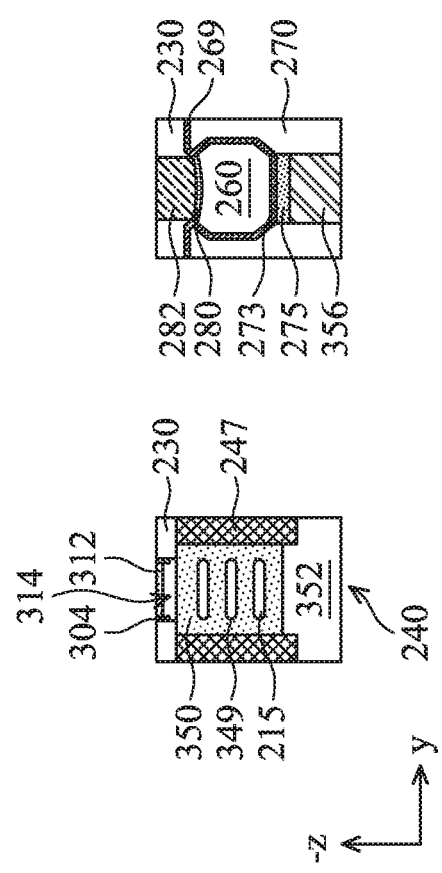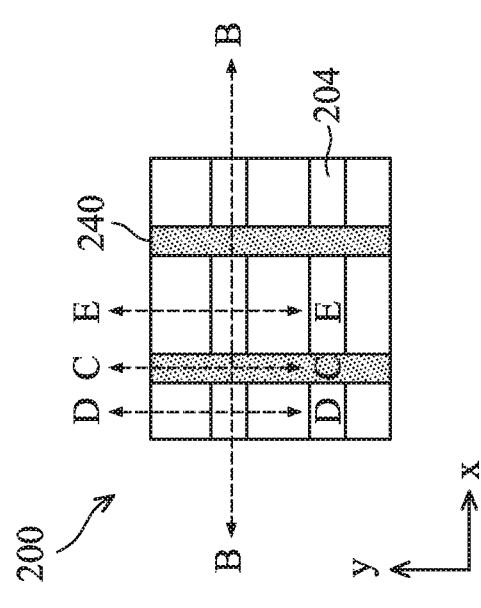
FIG. 15A
FIG. 15B
FIG. 15C
FIG. 15D
FIG. 15E

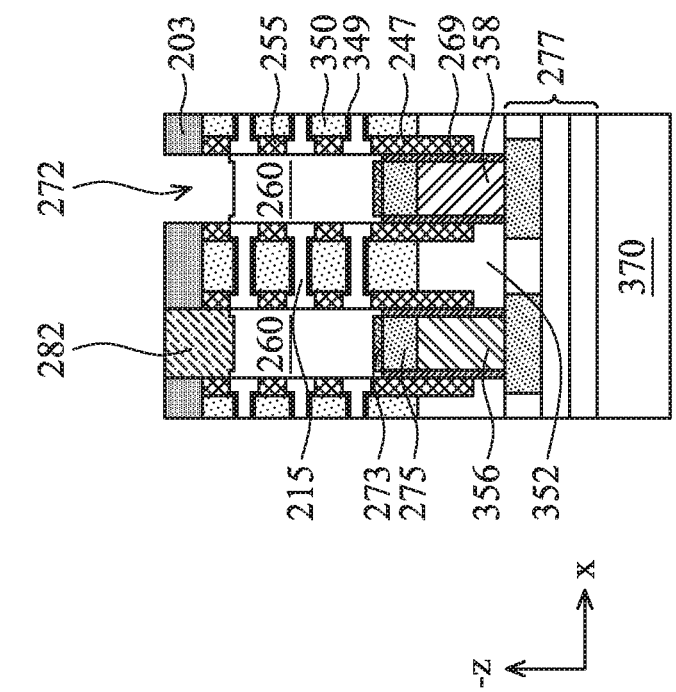
FIG. 17B
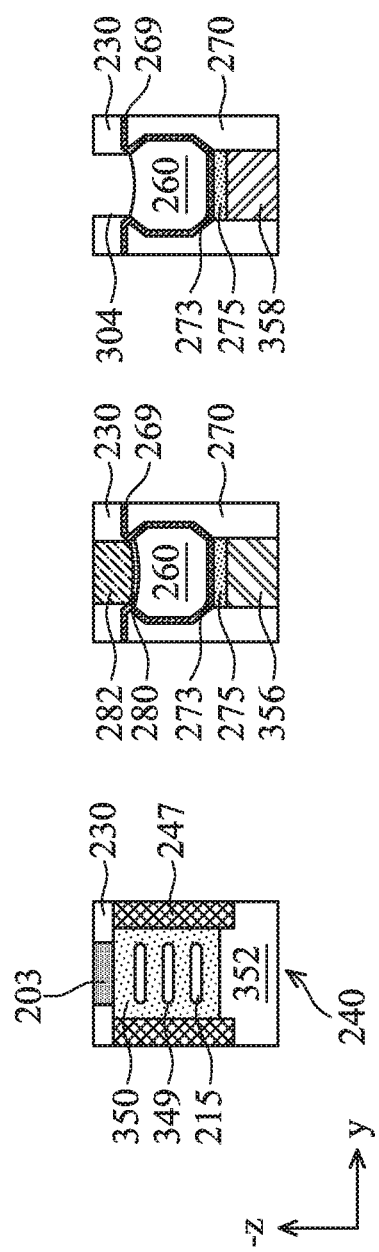
FIG. 17D
FIG. 17E
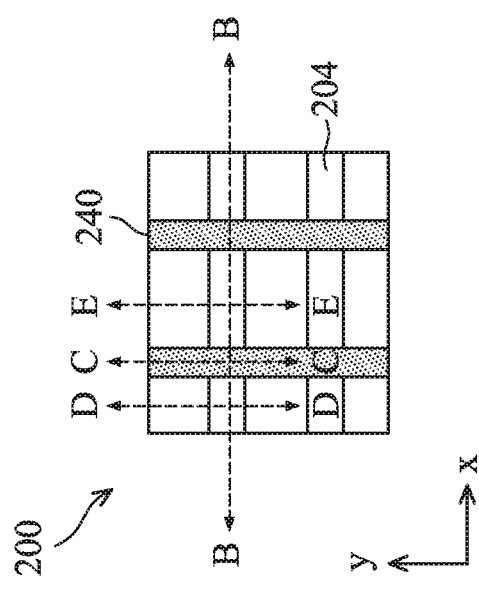
FIG. 17A
FIG. 17C

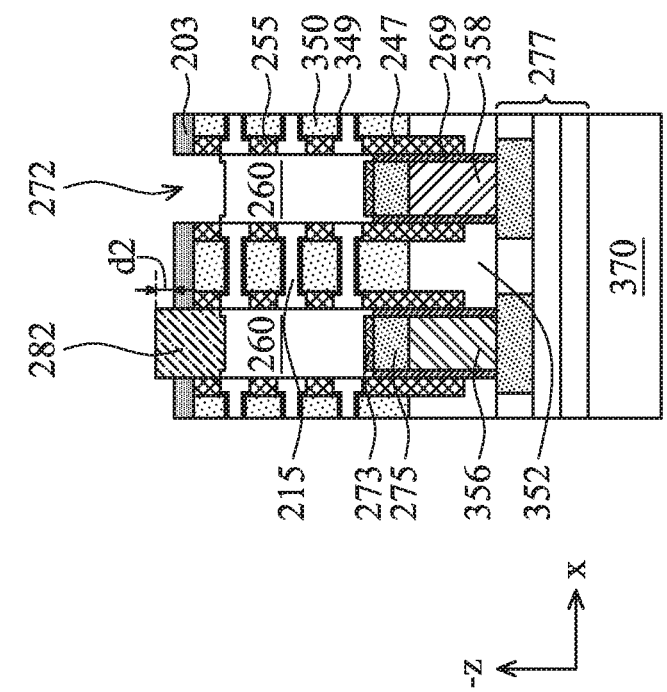
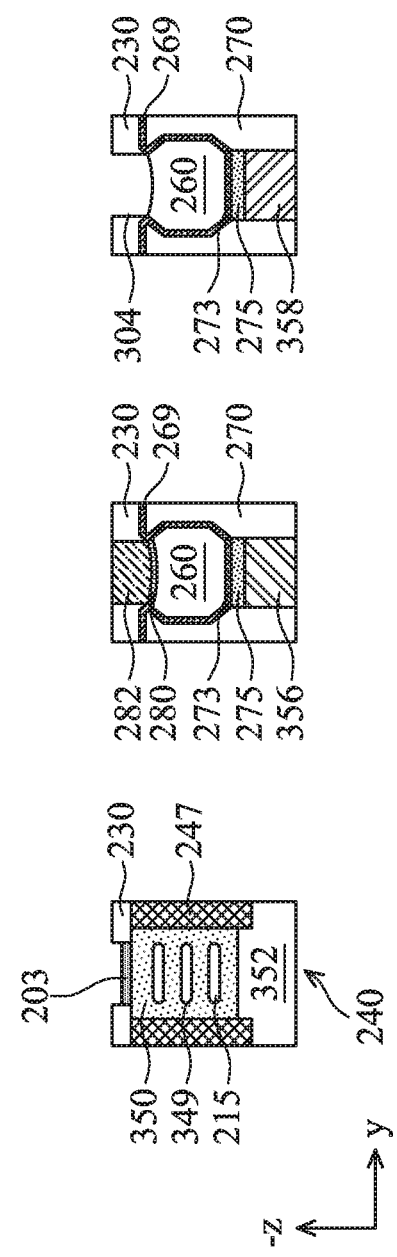
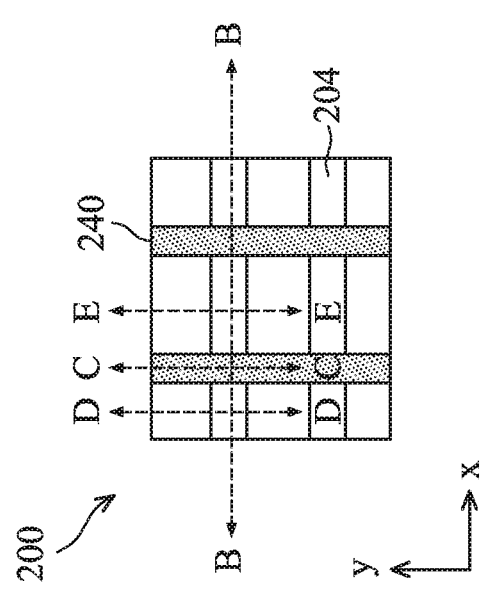
FIG. 18A  FIG. 18B  FIG. 18C  FIG. 18D  FIG. 18E

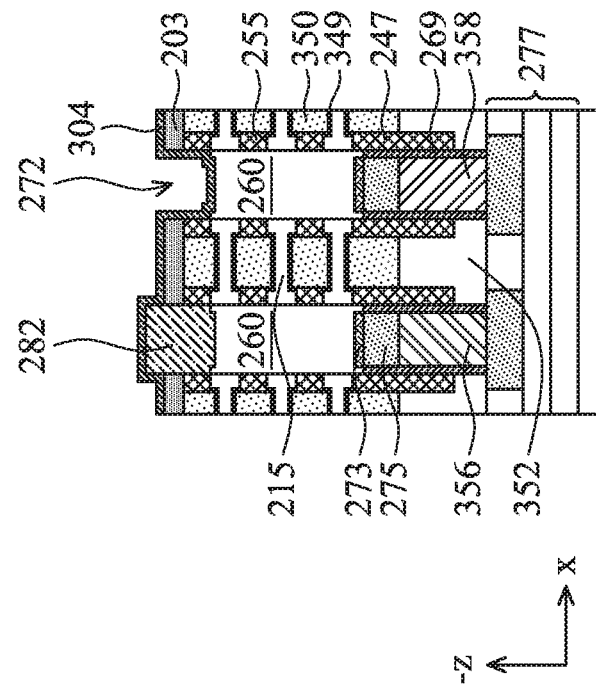
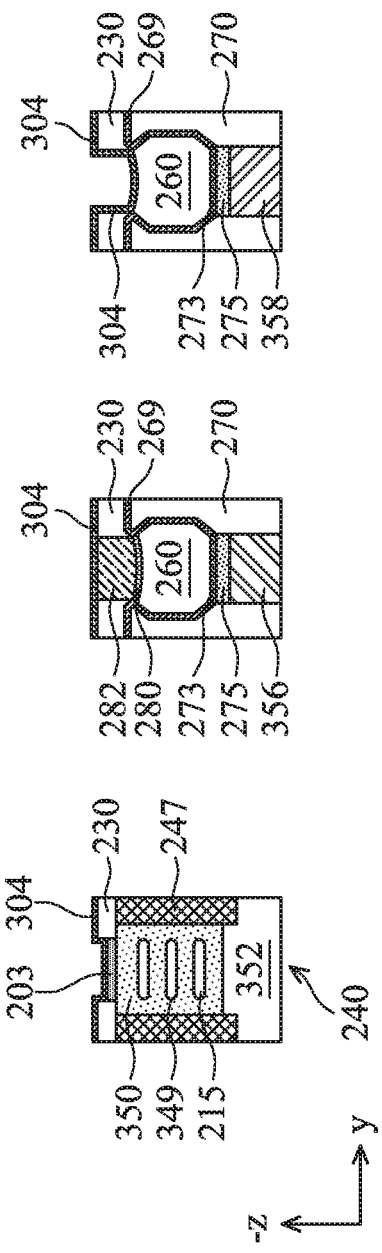
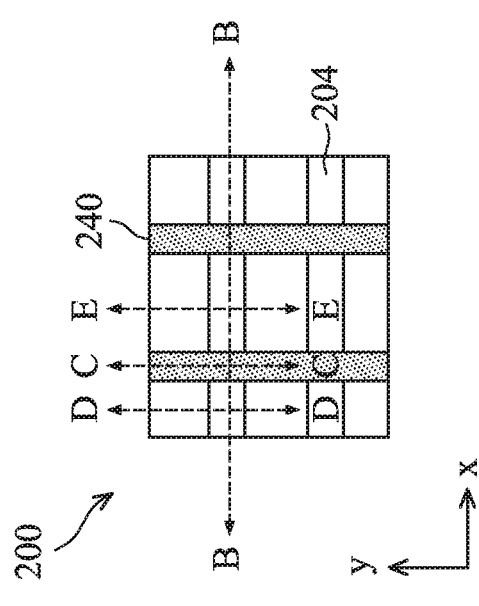
FIG. 19A
FIG. 19B
FIG. 19C
FIG. 19D
FIG. 19E

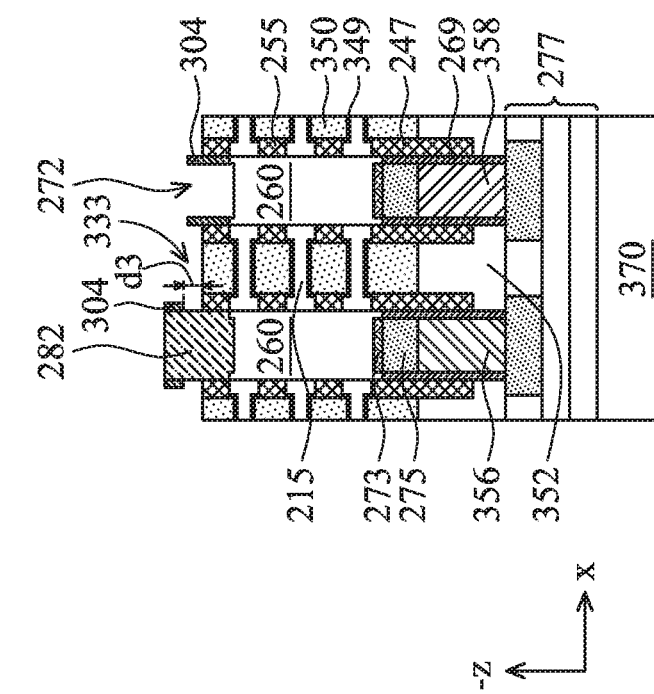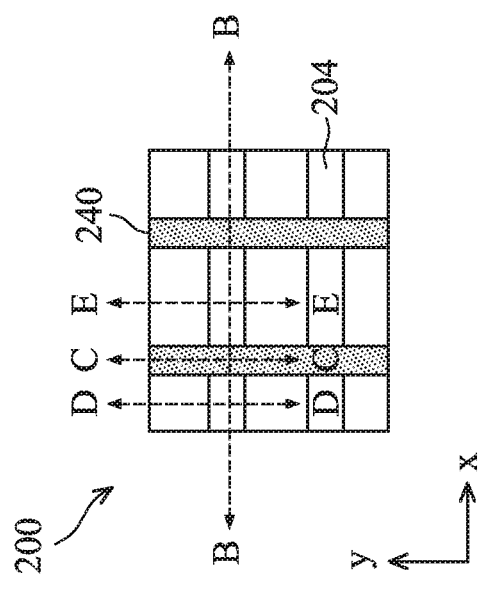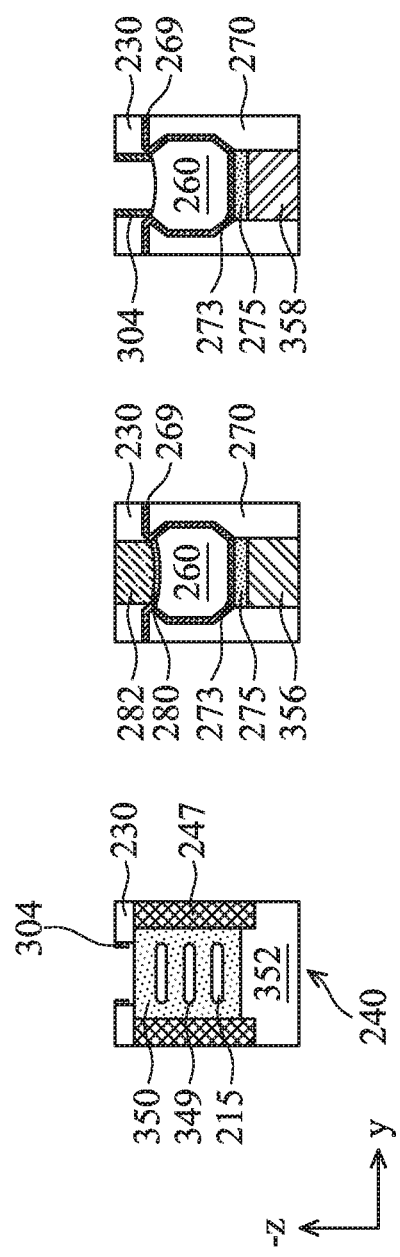
FIG. 21A
FIG. 21B
FIG. 21C
FIG. 21D
FIG. 21E

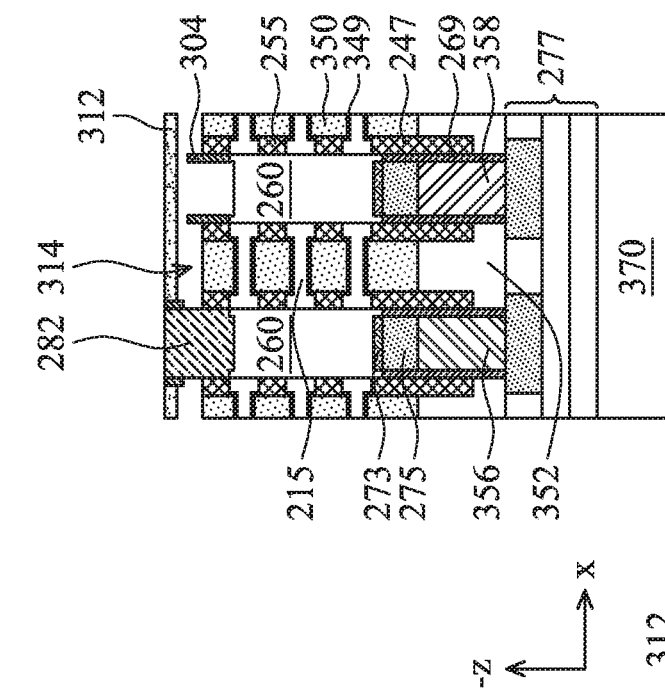
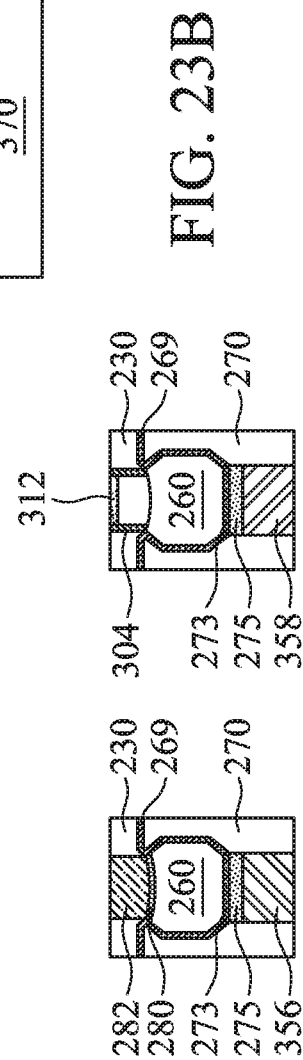
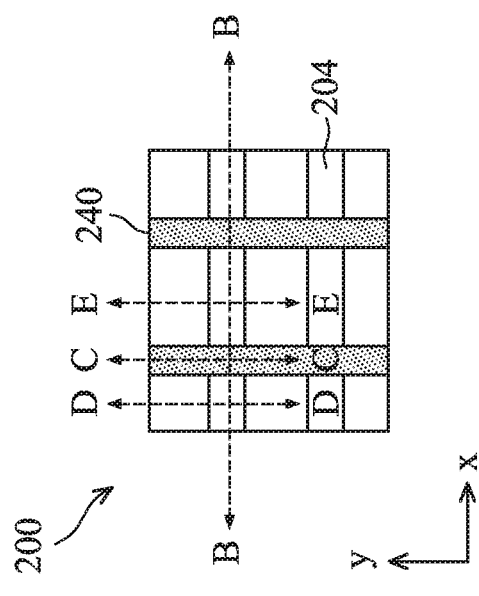
FIG. 23A
FIG. 23B
FIG. 23C
FIG. 23D
FIG. 23E

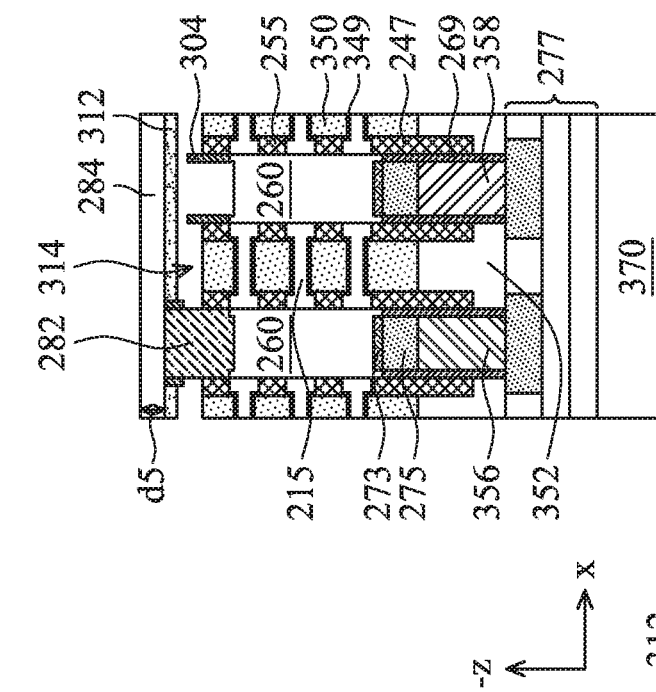
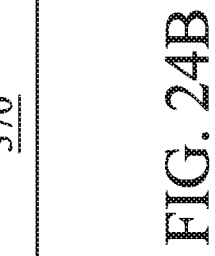
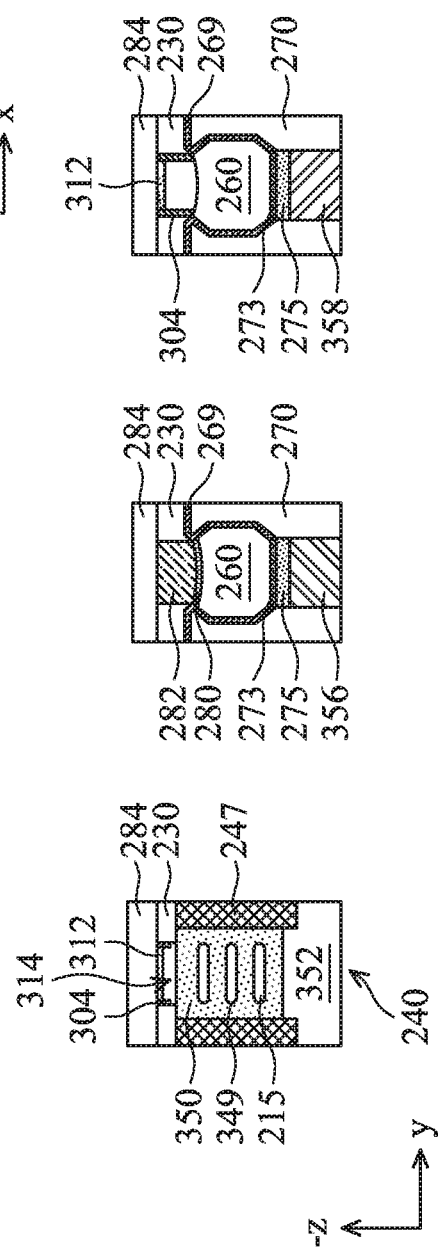
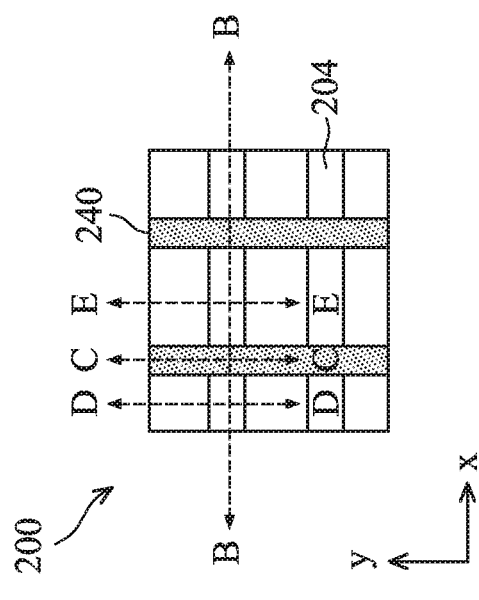
FIG. 24A
FIG. 24B
FIG. 24C
FIG. 24D
FIG. 24E

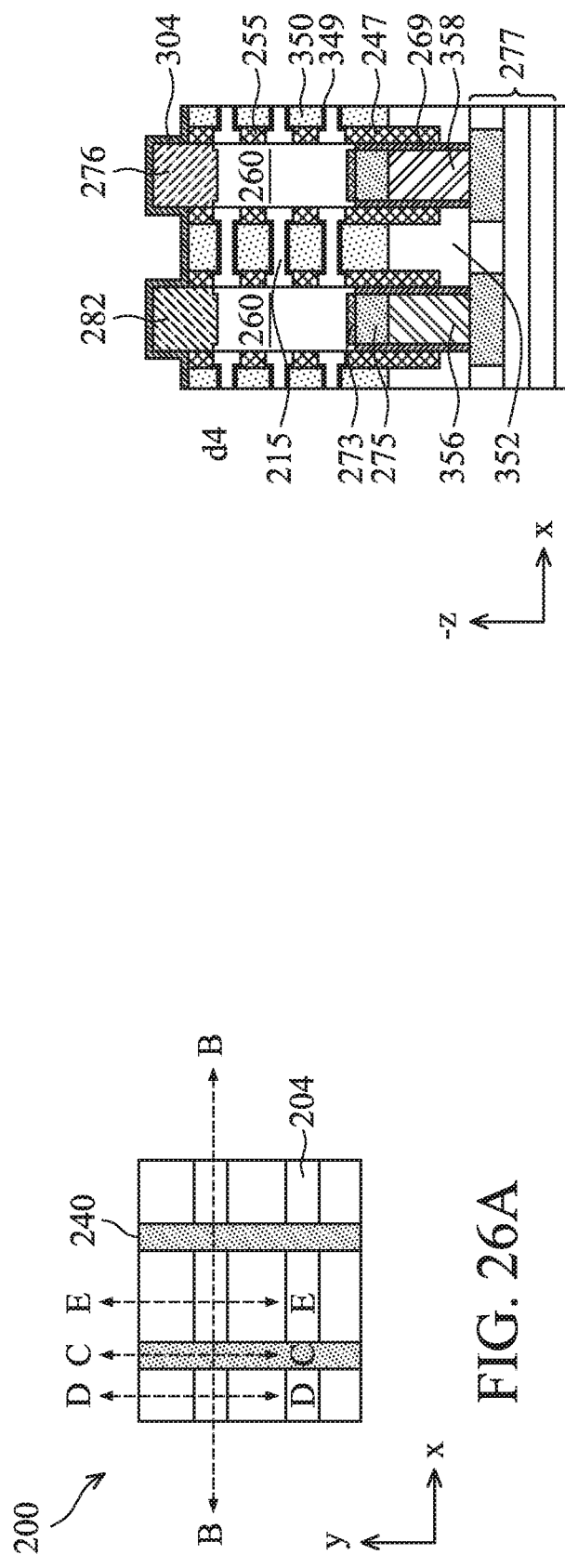
FIG. 26B
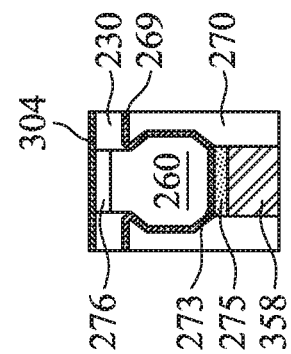
FIG. 26E
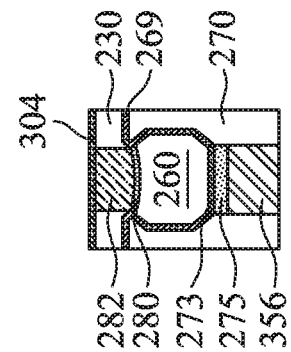
FIG. 26D
FIG. 26A
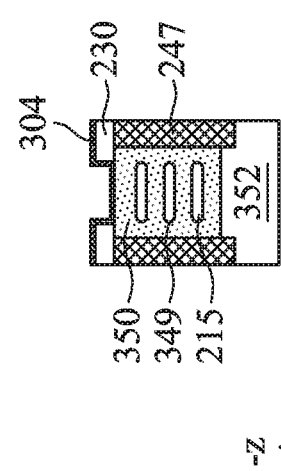
FIG. 26C

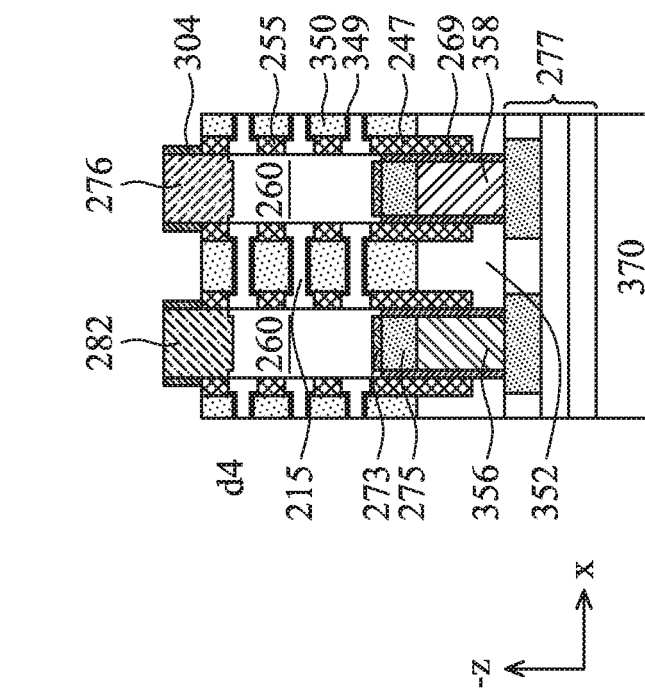
FIG. 27B
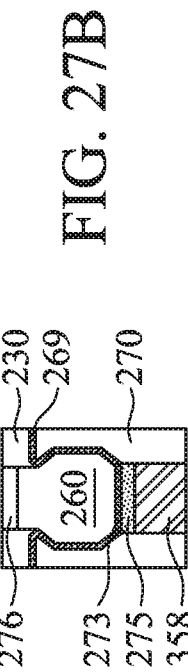
FIG. 27E
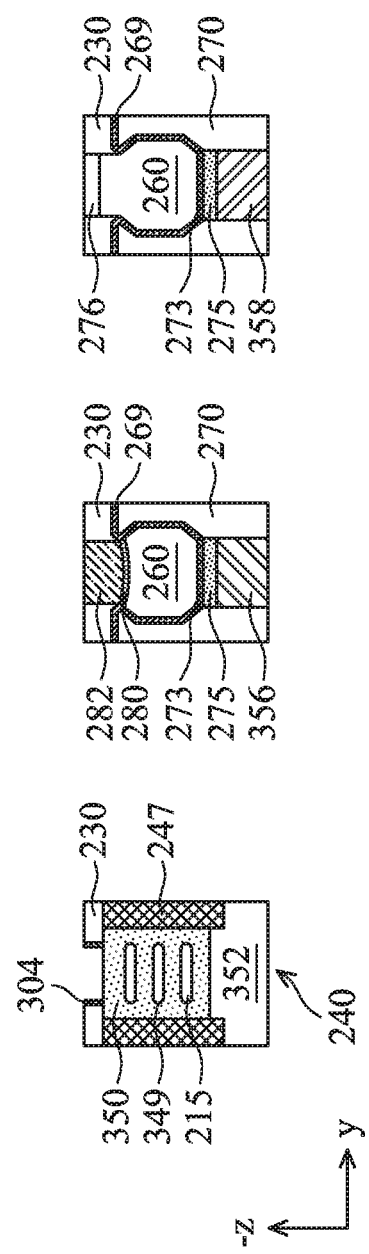
FIG. 27D
FIG. 27A
FIG. 27C

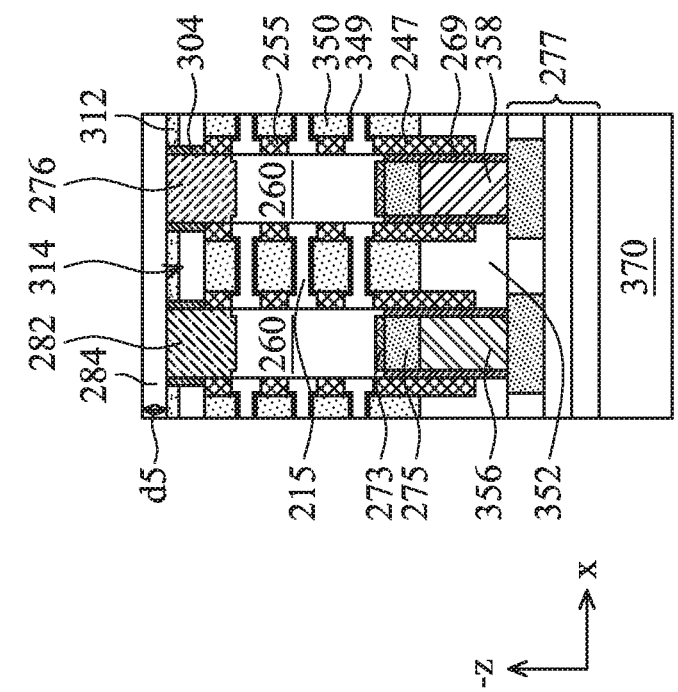
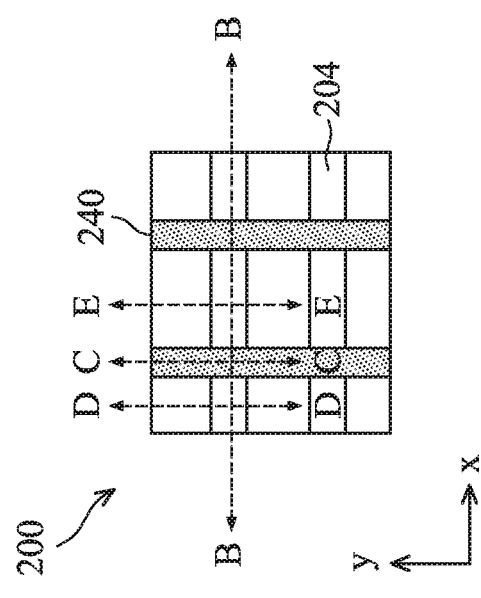
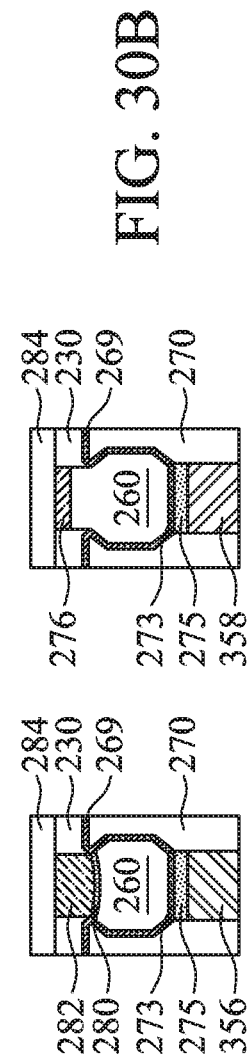
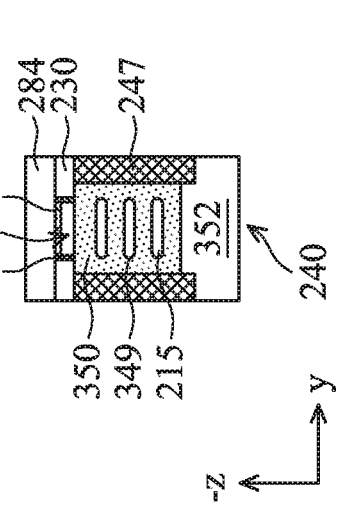
FIG. 30A  FIG. 30B  FIG. 30C  FIG. 30D  FIG. 30E

US 11,410,876 B2

SEMICONDUCTOR DEVICE WITH AIR GAPS AND METHOD OF FABRICATION THEREOF

PRIORITY

This claims the benefits to U.S. Provisional Application Ser. No. 63/031,281 filed May 28, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which can extend around the channel region providing access to the channel on four sides. GAA devices are compatible with conventional complementary metal-oxide-semiconductor (CMOS) processes and their structure allows them to be aggressively scaled while maintaining gate control and mitigating SCEs.

Conventionally, multi-gate devices (e.g., FinFETs and GAA devices) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails and vias on the backside of an IC with reduced resistance and reduced coupling capacitance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A illustrate top views of a portion of a semiconductor device, according to some embodiments.

FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, and 30B illustrate cross-sectional views of a portion of the semiconductor device along the B-B line in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively, according to some embodiments.

FIGS. 2C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, 29C, and 30C illustrate cross-sectional views of a portion of the semiconductor device along the C-C line in FIGS. 2A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively, according to some embodiments.

FIGS. 2D, 4D, 5D, 6D, 7D, 8D, 9D, 10D, 11D, 12D, 13D, 14D, 15D, 16D, 17D, 18D, 19D, 20D, 21D, 22D, 23D, 24D, 25D, 26D, 27D, 28D, 29D, and 30D illustrate cross-sectional views of a portion of the semiconductor device along the D-D line in FIGS. 2A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively, according to some embodiments.

FIGS. 2E, 4E, 5E, 6E, 7E, 8E, 9E, 10E, 11E, 12E, 13E, 14E, 15E, 16E, 17E, 18E, 19E, 20E, 21E, 22E, 23E, 24E, 25E, 26E, 27E, 28E, 29E, and 30E illustrate cross-sectional views of a portion of the semiconductor device along the E-E line in FIGS. 2A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively, according to some embodiments.

DETAILED DESCRIPTION

Figure 1A:
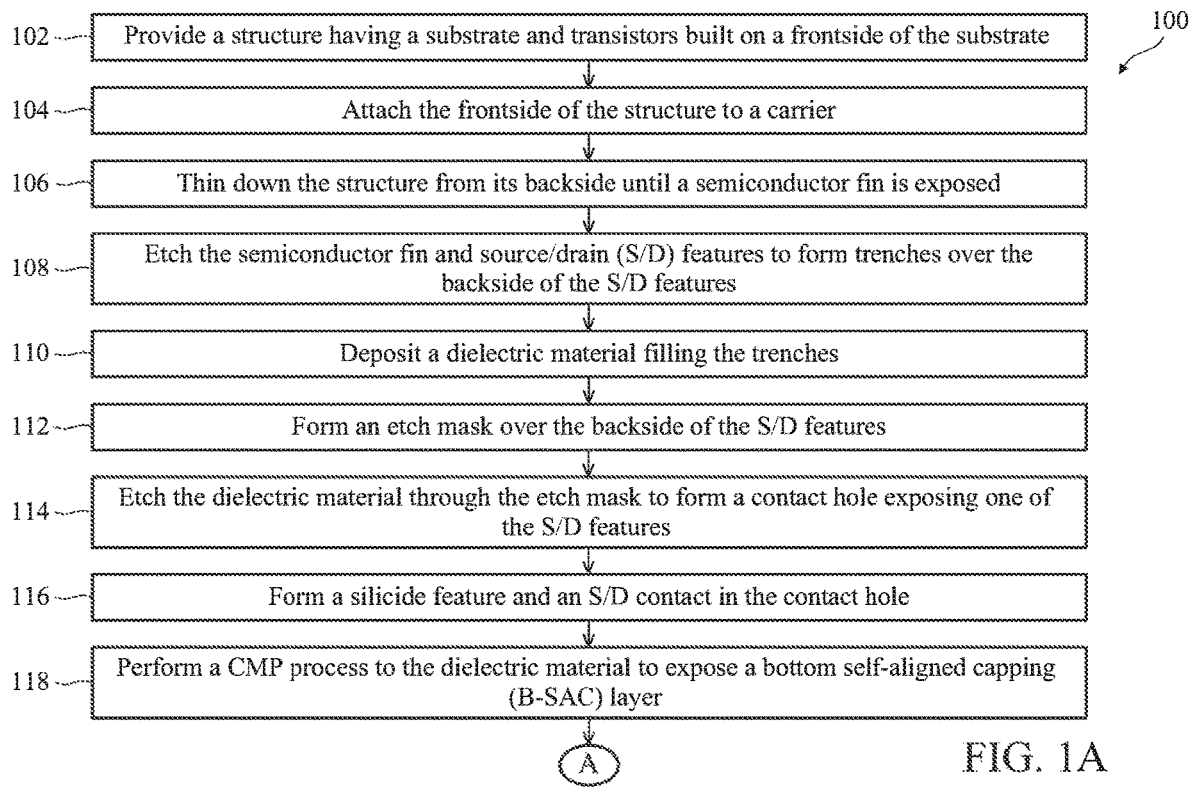
FIGS. 1A, 1B, 1C, and 1D show flow charts of various embodiments of a method of forming a semiconductor device with backside metal wiring layers and backside air gaps, according to various aspects of the present disclosure.
Figure 1B:
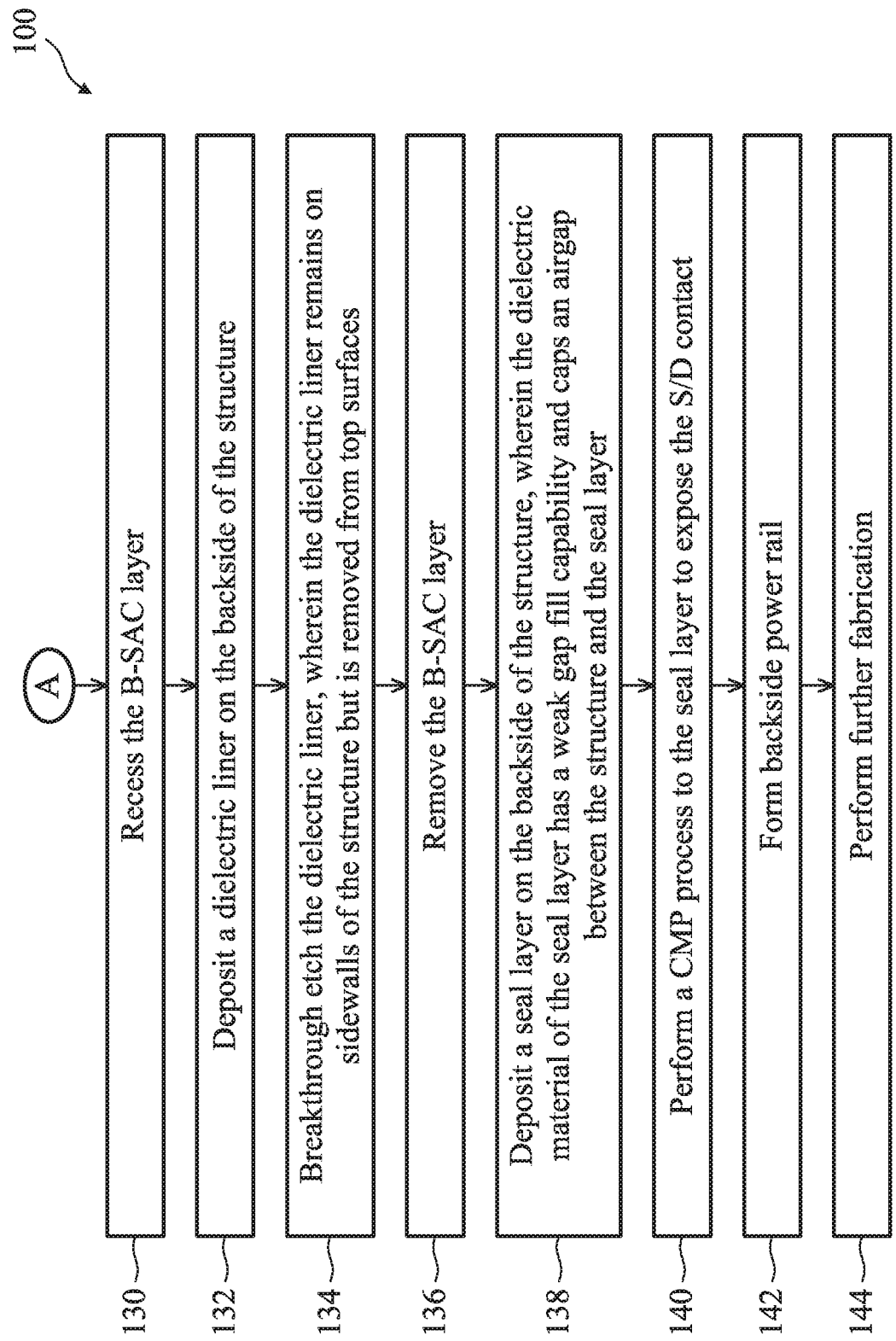

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside metal wiring layers (e.g., power rails) and backside air gaps. Power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides backside air gaps interposing gate stacks and backside power rails. Without backside air gaps, a bottom self-aligned capping (B-SAC) layer may be used to provide isolation between gate stacks and backside power rails. Dielectric material with a relatively high dielectric constant is often needed for a B-SAC layer to provide etching selectivity during via backside etching. However, a B-SAC layer with high dielectric constant increases coupling capacitance between gate stacks and backside power rails. With the incorporation of air gaps, the coupling capacitance can be reduced, which helps an IC to operate faster. Further, with the incorporation of air gaps, there is no leakage path between gate stacks and backside power rails, which increases an IC's TDDB (time-dependent dielectric breakdown) performance.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

FIGS. 1A-1D are flow charts of a method 100 for fabricating a semiconductor device according to various embodiments of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 30E that illustrate various top and cross-sectional views of a semiconductor device (or device) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 30E have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 1A) provides device 200 having a substrate 201 and transistors built on a frontside of the substrate 201. FIG. 2A illustrates a top view of the device 200, and FIGS. 2B, 2C, 2D, and 2E illustrate cross-sectional views of the device 200, in portion, along the B-B line, the C-C line, the D-D line, and the E-E line in FIG. 2A, respectively. Particularly, the B-B line is cut along the lengthwise direction of a semiconductor fin 204 (direction "X"), the C-C line is cut along the lengthwise direction of a gate stack 240 (direction "Y"), the D-D line is cut into the source regions of the transistors and is parallel to the gate stacks 240, and the E-E line is cut into the drain regions of the transistors and is parallel to the gate stacks 240. The B-B lines, C-C lines, D-D lines, and E-E lines in FIGS. 3A through 30A are similarly configured. It is noted that in various embodiments, the D-D line can be alternatively cut into the drain regions of the transistors and the E-E line can be alternatively cut into the source regions of the transistors. In the present disclosure, a source and a drain are interchangeably used.

Referring to FIGS. 2A-2E, the semiconductor device 200 includes the substrate 201 at its backside and various elements built on the front surface of the substrate 201. These elements include an isolation structure 230 over the substrate 201, a semiconductor fin (or fin) 204 extending from the substrate 201 and adjacent to the isolation structure 230, two source/drain (S/D) features 260 over the fin 204, one or more semiconductor channel layers (or channel layers) 215 suspended over the fin 204 and connecting the two S/D features 260, a gate stack 240 between the two S/D features 260 and wrapping around each of the channel layers 215, and a bottom self-aligned capping (B-SAC) layer 203 disposed between the fin 204 and both the channel layers 215 and the gate stack 240. The device 200 further includes inner spacers 255 between the S/D features 260 and the gate stack 240, a (outer) gate spacer 247 over sidewalls of the gate stack 240 and over the topmost channel layer 215, a contact etch stop layer (CESL) 269 adjacent to the gate spacer 247 and over the epitaxial S/D features 260 and the isolation structure 230, an inter-layer dielectric (ILD) layer 270 over the CESL 269. Over the gate stack 240, the semiconductor device 200 further includes a self-aligned capping (SAC) layer 352. Over the epitaxial S/D features 260, the semiconductor device 200 further includes silicide features 273, S/D contacts 275, dielectric S/D capping layer 356, and S/D contact via 358. In the depicted embodiment, the S/D capping layer 356 is disposed over the source feature 260, and the S/D contact via 358 is disposed over the drain feature 260. In alternative embodiments, the S/D capping layer 356 may be disposed over the drain feature 260, and the S/D contact via 358 may be disposed over the source feature 260. In some embodiments, the S/D capping layer 356 may be disposed over both the source and the drain features 260. In some embodiments the S/D contact vias 358 may be disposed over both the source and the drain features 260.

Figure 3B:
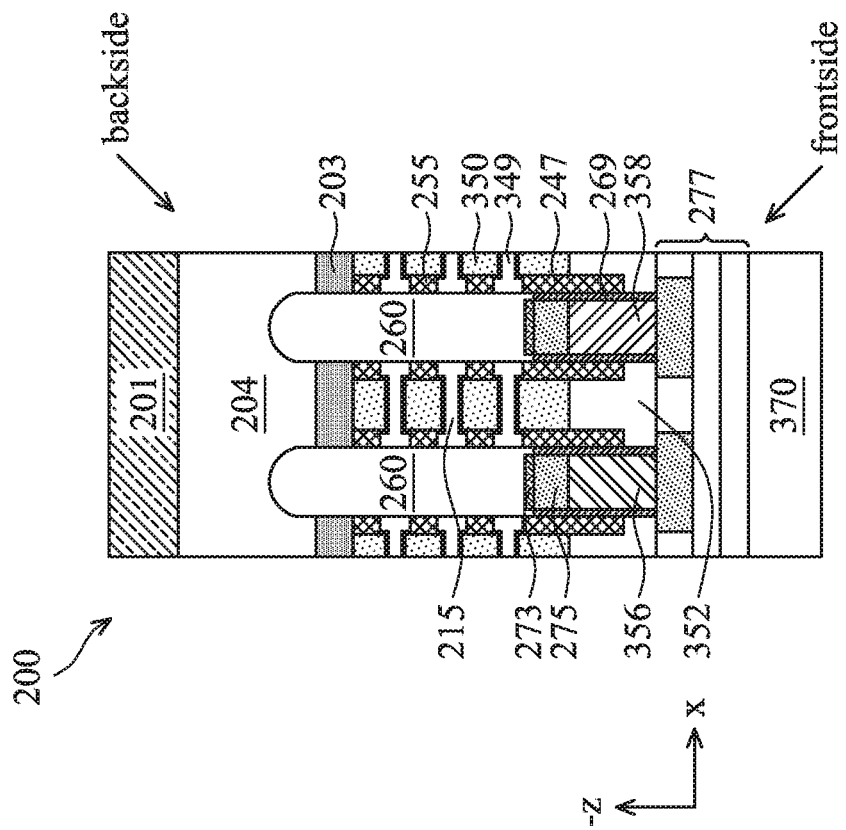
Figure 3A:
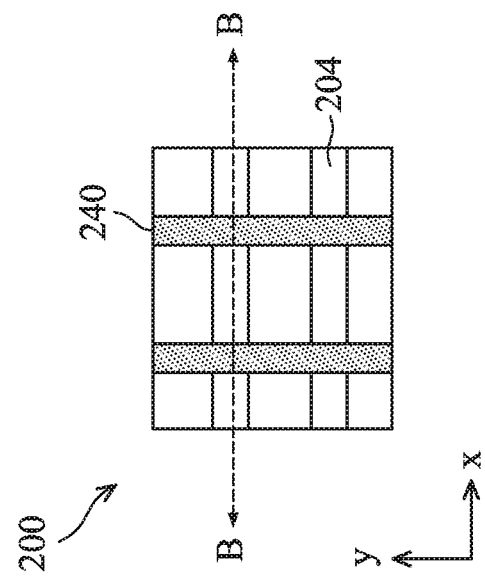
Figure 4A:
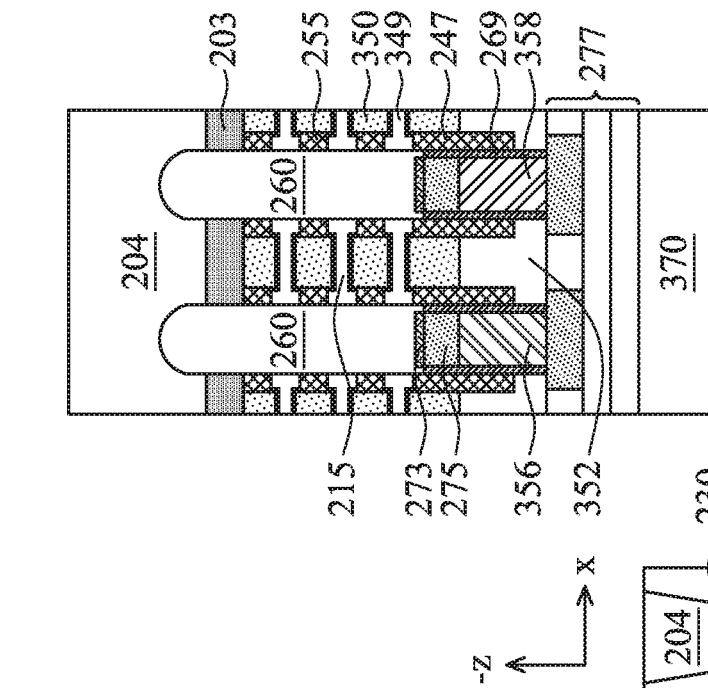
Figure 4D:
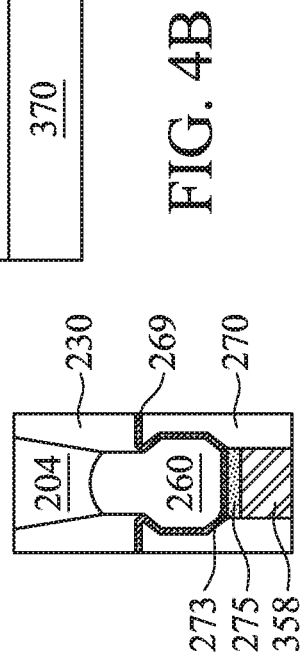
Figure 4E:
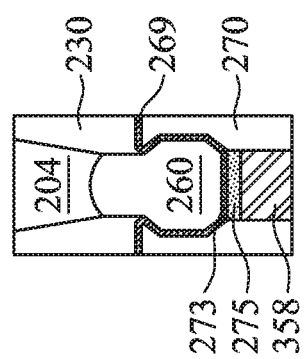
Figure 4C:
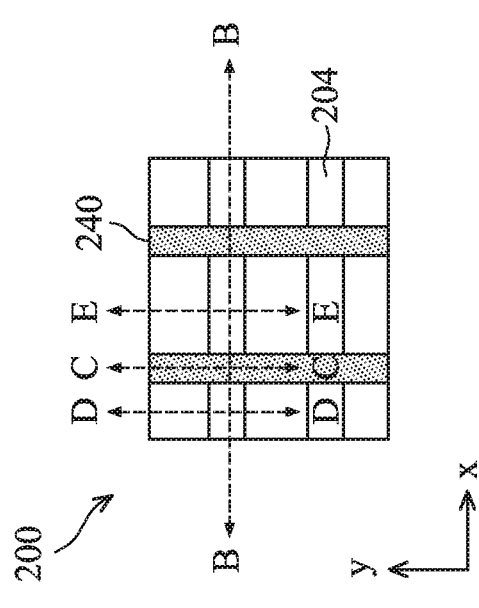
Figure 4B:
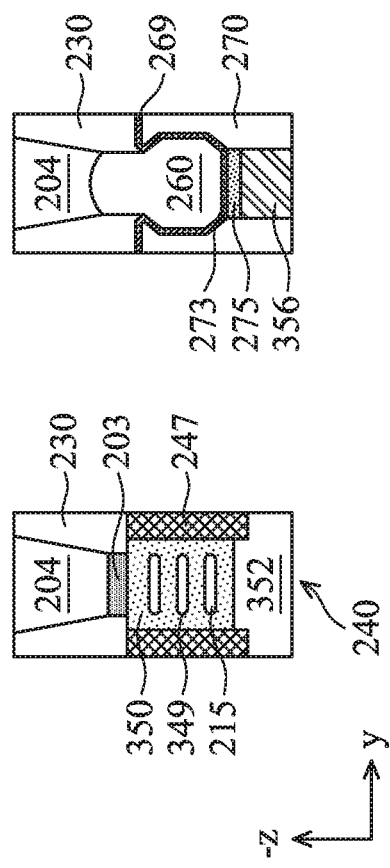
Figure 7A:
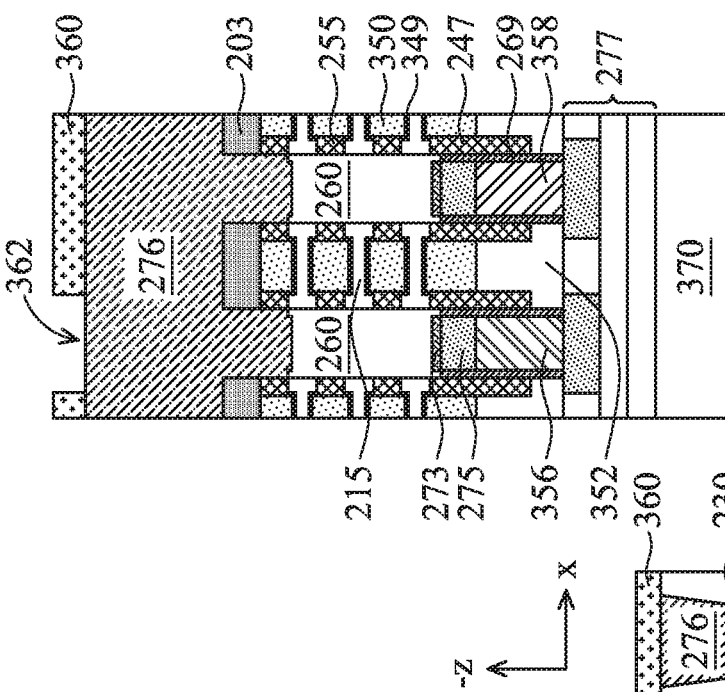
Figure 7B:
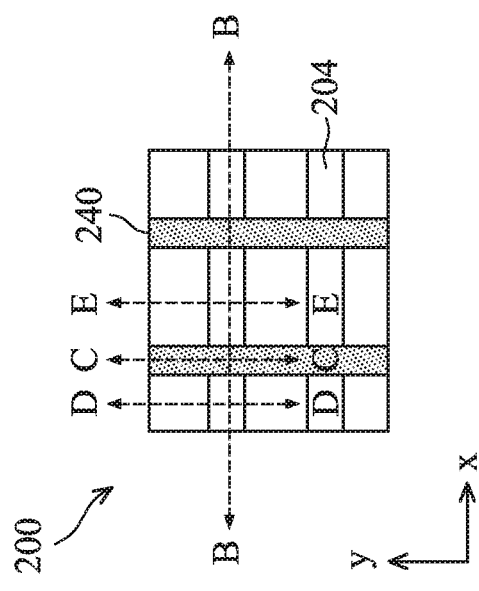
Figure 7C:
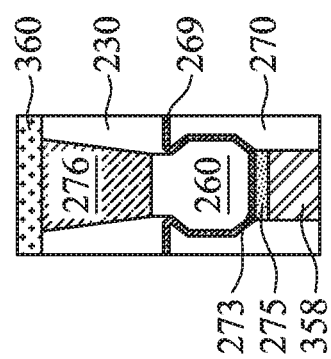
Figure 7D:
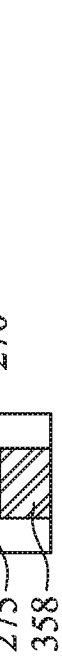
Figure 7E:
Figure 12A:
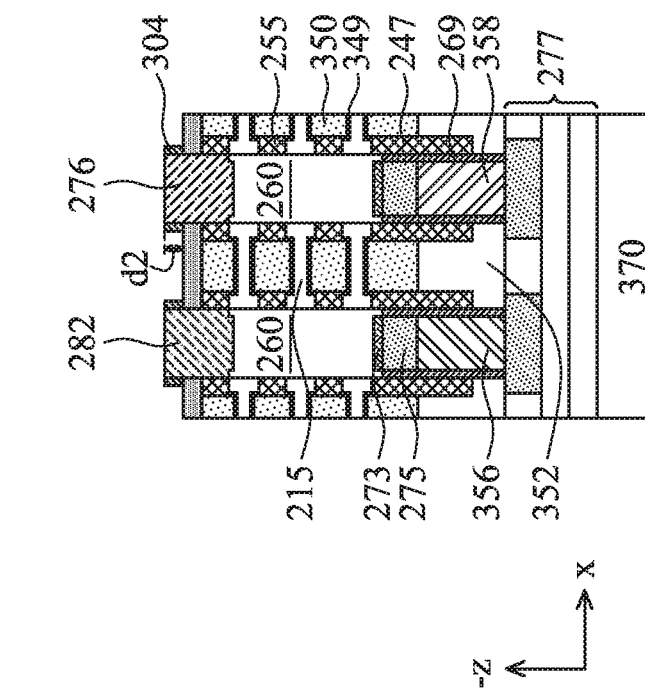
Figure 12B:
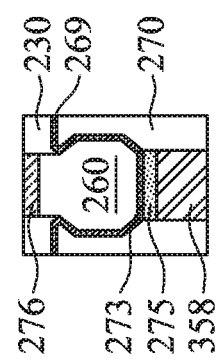
Figure 12C:
Figure 12D:
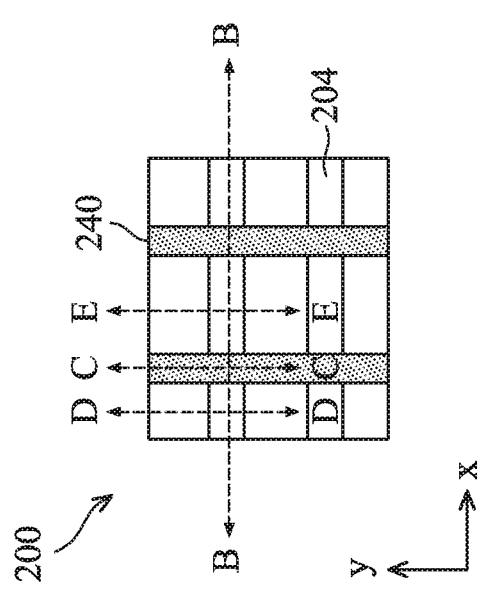
Figure 12E:
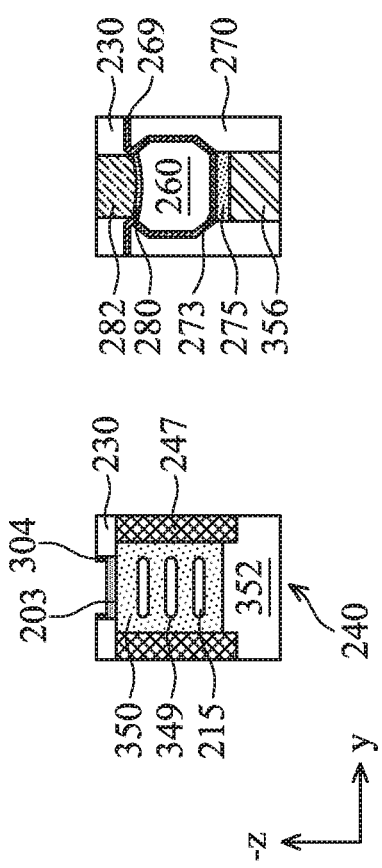

Referring to FIGS. 3A and 3B, the semiconductor device 200 further includes one or more interconnect layers (denoted with 277) with wires and vias embedded in dielectric layers. The one or more interconnect layers connecting gate, source, and drain electrodes of various transistors, as well as other circuits in the device 200, to form an integrated circuit in part or in whole. The device 200 may further include passivation layers, adhesion layers, and/or other layers built on the frontside of the semiconductor device 200. These layers and the one or more interconnect layers are collectively denoted with the label 277. It is noted that the semiconductor device 200 is flipped upside down in FIG. 3B. The various elements of the semiconductor device 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

In embodiments, the fin 204 may include silicon, silicon germanium, germanium, or other suitable semiconductor, and may be doped n-type or p-type dopants. The fin 204 may be patterned by any suitable method. For example, the fin 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 204. For example, the masking element may be used for etching recesses into semiconductor layers over or in the substrate 201, leaving the fin 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fin 204 may be suitable.

The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 can include different structures, such as shallow trench isolation (STI) features and/or deep trench isolation (DTI) features. In an embodiment, the isolation structure 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form the isolation structure 230. In some embodiments, the isolation structure 230 include multiple dielectric layers, such as a silicon nitride layer disposed over a thermal oxide liner layer.

The S/D features 260 include epitaxially grown semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other sacrificial semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stack 240, the sacrificial semiconductor layers are selectively removed, leaving the channel layers 215 suspended over the fin 204.

In some embodiments, the inner spacers 255 include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacers 255 include a low-k dielectric material, such as those described herein. The inner spacers 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacers 255.

In some embodiments, the B-SAC layer 203 may include one or more of $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, and other suitable material(s). In some embodiments, the B-SAC layer 203 may include a low-k dielectric material such as a dielectric material including Si, O, N, and C. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, or combinations thereof. The B-SAC layer 203 may be deposited using CVD, ALD, PVD, or oxidation. In an embodiment, the B-SAC layer 203 is initially deposited on the fin 204 and is patterned using the same process that patterns the fin 204. In another embodiment, a sacrificial semiconductor layer (such as SiGe) is initially deposited on the fin 204 and is patterned using the same process that patterns the fin 204. The sacrificial layer is removed and replaced with the B-SAC layer 203 during a gate replacement process that forms the gate stack 240. As explained in greater detail below, the B-SAC layer 203 reserves a space for an air gap sandwiched between the gate stack 240 and a backside metal wiring layer (and a seal layer) to be formed in subsequent processes. In some embodiments, the B-SAC layer 203 may have a thickness d1 in a range of about 1 nm to about 20 nm. In some embodiments, if the B-SAC layer 203 is too thin (such as less than 1 nm), then the subsequently-formed air gap may not provide sufficient isolation between the gate stack 240 and the backside metal wiring layer. In some embodiments, if the B-SAC layer 203 is too thick (such as more than 20 nm), then the subsequently-formed backside S/D contacts and vias would be long and the resistance thereof would be high, which may reduce circuit speed. In some embodiments, portions of the B-SAC layer between two adjacent S/D features 260 have a length d4 (measured along the "x" direction) in a range of about 3 nm to about 30 nm. The length d4 is also the lateral distance between two adjacent S/D features 260. As explained in greater detail below, the length d4 defines an opening of a subsequently-formed air gap. The range of the length d4 is set in a way to facilitate a later-on capping process to seal the air gap. If the length d4 is larger than about 30 nm, the opening will be too large for the capping process to seal the air gap. If the length d4 is smaller than about 3 nm, the dimensions of various features in the gate stack 240 may be too close to the critical dimension (CD) and result in poor process windows.

In the depicted embodiment, the gate stack 240 includes a gate dielectric layer 349 and the gate electrode layer 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form the gate spacers 247. In some embodiments, the gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In some embodiments, the SAC layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 352 protects the gate stacks 240 from etching and CMP processes that are used for etching S/D contact holes. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials. The SAC layer 352 may have a thickness in a range of about 3 nm to about 30 nm, for example.

In embodiments, the CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 270 may be formed by PE-CVD (plasma enhanced CVD), F-CVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275.

In some embodiments, the S/D capping layer 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The capping layer 356 protects the S/D contacts 275 from etching and CMP processes and isolates the S/D contacts 275 from the interconnect structure formed thereon. The S/D capping layer 356 may have a thickness in a range of about 3 nm to about 30 nm, for example. In some embodiments, the SAC layer 352 and the S/D capping layer 356 include different materials to achieve etch selectivity, for example, during the formation of the S/D capping layer 356.

In an embodiment, the S/D contact via 358 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact via 358.

At operation 104, the method 100 (FIG. 1A) flips the device 200 upside down and attaches the frontside of the device 200 to a carrier 370, such as shown in FIG. 3B. This makes the device 200 accessible from the backside of the device 200 for further processing. The operation 104 may use any suitable attaching processes, such as direct bonding, hybrid bonding, using adhesive, or other bonding methods. The operation 104 may further include alignment, annealing, and/or other processes. The carrier 370 may be a silicon wafer in some embodiments. In FIGS. 2A-30E, the "z" direction points from the backside of the device 200 to the frontside of the device 200, while the "-z" direction points from the frontside of the device 200 to the backside of the device 200.

At operation 106, the method 100 (FIG. 1A) thins down the device 200 from the backside of the device 200 until the fin 204 and the isolation structure 230 are exposed from the backside of the device 200. The resultant structure is shown in FIGS. 4A-4E according to an embodiment. For simplicity, FIGS. 4C, 4D, and 4E omit some features that are already shown in FIG. 4B, particularly the layer 277 and the carrier 370. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

At operation 108, the method 100 (FIG. 1A) selectively etches the fin 204 to form trenches 272 over the backside of the gate stack 240 and the S/D features 260. The trenches 272 expose surfaces of the S/D features 260 from the backside. The resultant structure is shown in FIGS. 5A-5E according to an embodiment. In the present embodiment, the operation 108 applies an etching process that is tuned to be selective to the materials of the semiconductor material (e.g. silicon) in fin 204 and with no (or minimal) etching to the gate stacks 240, the isolation structure 230, and the B-SAC layer 203. In the present embodiment, the etching process also etches the S/D features 260 to recess it to a level that is even with or below the bottommost surface of the channel layers 215. In furtherance of some embodiments, the recessed S/D features 260 remain higher than an interface between the isolation structure 230 and the CESL 269, as illustrated in FIGS. 5D and 5E. In some alternative embodiments, the operation 108 may further recess the S/D features 260 below an interface between the isolation structure 230 and the CESL 269 (not shown). The operation 108 may apply more than one etching processes. For example, it may apply a first etching process to selectively remove the fin 204, and then apply a second etching process to selectively recess the S/D features 260 to the desired level, where the first and the second etching processes use different etching parameters such as using different etchants. The etching process(es) can be dry etching, wet etching, reactive ion etching, or other etching methods. The B-SAC layer 203 protects the gate stack 240 from the one or more etching processes.

At operation 110, the method 100 (FIG. 1A) deposits a dielectric layer 276 with one or more dielectric materials to fill the trenches 272. In some embodiments, the dielectric layer 276 may include one or more of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be formed by PE-CVD, F-CVD or other suitable methods. Further, in the present embodiment, the dielectric layer 276 and the B-SAC layer 203 may include different materials so that the B-SAC layer 203 may act as a CMP stop when the dielectric layer 276 is planarized by the CMP process.

At operation 112, the method 100 (FIG. 1A) forms an etch mask 360 over the backside of the device 200. The etch mask 360 provides openings 362 over the backside of the S/D features 260 that are to be connected to backside contacts and backside metal wiring layers. The resultant structure is shown in FIGS. 7A-7E according to an embodiment. In the illustrated embodiment, the opening 362 is provided over the backside of the source feature 260 while the backside of the gate stack 240 and the drain feature 260 are covered by the etch mask 360. In various embodiments, the openings 362 may be provided over the backside of drain features only, source features only, or both source and drain features. The etch mask 360 includes a material that is different than a material of the dielectric layer 276 to achieve etching selectivity during backside contact hole etching. For example, the etch mask 360 includes a resist material (and thus may be referred to as a patterned resist layer and/or a patterned photoresist layer). In some embodiments, the etch mask 360 has a multi-layer structure, such as a resist layer disposed over an anti-reflective coating (ARC) layer and/or a hard mask layer comprising silicon nitride or silicon oxide. The present disclosure contemplates other materials for the etch mask 360, so long as etching selectivity is achieved during the etching of the dielectric layer 276. In some embodiments, operation 112 uses a lithography process that includes forming a resist layer over the backside of the device 200 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer (e.g., the etch mask 360) includes a resist pattern that corresponds with the mask. Alternatively, the exposure process can be implemented or replaced by other methods, such as maskless lithography, e-beam writing, ion-beam writing, or combinations thereof.

At operation 114, the method 100 (FIG. 1A) etches the dielectric layer 276 through the etch mask 360 to form an S/D contact hole 278. The etch mask 360 is subsequently removed, for example, by a resist stripping process or other suitable process. The resultant structure is shown in FIGS. 8A-8E according to an embodiment. The S/D contact hole 278 exposes the source feature 260. In the illustrated embodiment, the etching process also etches the source feature 260 to recess it to a level that is even with or below the interface between the isolation structure 230 and the CESL 269. This is for preparing the source feature 260 for subsequent silicide formation. As a result, the source feature 260 may be below the drain feature 260, as shown in FIGS. 8D and 8E. In some embodiments, the operation 114 may apply more than one etching processes. For example, it may apply a first etching process to selectively remove the dielectric layer 276, and then apply a second etching process to selectively recess the source feature 260 to the desired level, where the first and the second etching processes use different etching parameters such as using different etchants. In an embodiment, the first etching process include a dry (plasma) etching process that is tuned to selectively etch the dielectric layer 276 and with no (or minimal) etching to the isolation structure 230, the B-SAC layer 203, the inner spacers 255, and the source feature 260. In alternative embodiments, first etching process may use other types of etching (such as wet etching or reactive ion etching) as long as the etch selectivity between the layers is achieved as discussed above. Since the first etching process has no or minimal etching to the isolation structure 230, the B-SAC layer 203, and the inner spacers 255, the contact hole is self-aligned to the source feature 260 in the y-z plane and in the x-z plane, thereby improving the process margin. The second etching process can be dry etching, wet etching, reactive ion etching, or other suitable etching methods, to selectively recess the source feature 260 to the desired level.

At operation 116, the method 100 (FIG. 1A) forms a silicide feature 280 and an S/D contact 282 in the S/D contact hole 278. The resultant structure is shown in FIGS. 9A-9E. In an embodiment, the operation 116 first deposits one or more metals into the trenches 272, performing an annealing process to the device 200 to cause reaction between the one or more metals and the source feature 260 to produce the silicide feature 280, and removing un-reacted portions of the one or more metals, leaving the silicide feature 280 in the trenches 272. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. In an embodiment, the operation 116 then deposits the S/D contact 282 over the silicide feature 280. The S/D contact 282 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes.

At operation 118, the method 100 (FIG. 1A) performs a CMP process to the dielectric layer 276 and the isolation structure 230 to remove excessive dielectric materials from the surface of the B-SAC layer 203. The resultant structure is shown in FIGS. 9A-9E according to an embodiment. Since the dielectric layer 276 and the isolation structure 230 include different materials from the B-SAC layer 203, the B-SAC layer 203 may act as a CMP stop when the device 200 is planarized by the CMP process. After the operation 118, a portion of the dielectric layer 276 remains in the trenches 272 over the drain feature 260 as an S/D capping layer. This portion of the dielectric layer 276 is also denoted as S/D capping layer 276. The CMP process also removes excessive metallic materials in the S/D contact 282 so that surfaces of the S/D contact 282, the S/D capping layer 276, and the B-SAC layer 203 are level. Accordingly, the thickness d1 of the B-SAC layer 203 also defines a distance of the S/D contact 282 protruding from the gate stack 240. As discussed above, the thickness d1 is in a range of about 1 nm to about 20 nm in some embodiments.

At operation 130, the method 100 (FIG. 1B) selectively etches the B-SAC layer 203 to recess the B-SAC layer 203 below surfaces of the S/D contact 282, the S/D capping layer 276, and the isolation structure 230. The resultant structure is shown in FIGS. 10A-10E according to an embodiment. In the present embodiment, the operation 130 applies an etching process that is tuned to be selective to the dielectric materials of the B-SAC layer 203 and with no (or minimal) etching to the S/D contact 282, the S/D capping layer 276, and the isolation structure 230. The etching process can be a plasma dry etching, a chemical dry etching, an ashing process, a wet etching, or other suitable etching methods. For example, the plasma dry etching process may use conventional dry etchant for dielectric material such as $C_4F_6$ mixed with $H_2$ or $O_2$, the chemical dry etching process may use one or more chemicals such as $H_2$, the ashing process may use oxygen or hydrogen ashing, and the wet etching process may apply a hot SPM solution (a mixture of sulfuric acid and hydrogen peroxide), for example, at a temperate above 100° C. As a result of the operation 130, portions of sidewalls of the S/D contact 282, the S/D capping layer 276, and the isolation structure 230 are protruding from the B-SAC layer 203 for a distance d2. The distance d2 can be controlled by adjusting duration of the etching process. In some embodiments, the distance d2 is in a range of about 2 nm to about 20 nm. As will be explained in further detail below, the distance d2 defines a vertical length of a dielectric liner to be formed on the protruding sidewalls of the S/D contact 282, the S/D capping layer 276, and the isolation structure 230 in subsequent processes. A lateral distance between the S/D contact 282 and the S/D capping layer 276 roughly equals the length d4 in a range of about 3 nm to about 30 nm.

At operation 132, the method 100 (FIG. 1B) deposits a dielectric liner 304 on the backside of the device 200. The resultant structure is shown in FIGS. 11A-11E according to an embodiment. In the illustrated embodiment, the dielectric liner 304 is conformally deposited to have a substantially uniform thickness along the various surfaces of the B-SAC layer 203, the isolation structure 230, the S/D contact 282, and the S/D capping layer 276. In various embodiments, the dielectric liner 304 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). The dielectric liner 304 may be deposited using ALD, CVD, or other suitable methods, and may have a thickness of about 0.5 nm to about 10 nm (e.g., as measured on the sidewalls of the S/D contact 282 along the "x" direction) in various embodiments.

At operation 134, the method 100 (FIG. 1B) performs an etching process for breaking through, and removing the majority of, the horizontal portions of the dielectric liner 304. The etching process is also referred to as a breakthrough (BT) etching process. The resultant structure is shown in FIGS. 12A-12E. In some embodiments, the BT etching process may include an anisotropic dry etch process, or the like. In some embodiments where the dielectric liner 304 is formed of an oxide compound, the BT etch process is a reactive ion etch (RIE) process with etch process gases including $CHF_3$, Ar, $CF_4$, $N_2$, $O_2$, $CH_2F_2$, $SF_3$, the like, or a combination thereof. The RIE process may be performed for an etch time between about 2 seconds and about 20 seconds, at a pressure between about 2 mTorr and about 30 mTorr, a temperature between about 10° C. and about 100° C., a radio frequency (RF) power between about 100 W and about 1500 W, and a voltage bias between about 10 V and about 800 V. In the illustrated embodiment, as a result of the operation 134, portions of the dielectric liner 304 remain on sidewalls of the S/D contact 282, the S/D capping layer 276, and the isolation structure 230. A vertical length of the dielectric liner 304 roughly equals the distance d2, in a range of about 2 nm to about 10 nm. As will be discussed in further detail below, the dielectric liner 304 functions as a landing pad to accumulate deposited dielectric material of a seal layer during a subsequent capping process to seal air gaps. If in some embodiments the length of the dielectric liner 304 is less than 2 nm, it may not provide enough landing area to sufficiently accumulate dielectric material in order to seal air gaps. If in some embodiments the length of the dielectric liner 304 is larger than 10 nm, deposited dielectric material of a seal layer may be introduced deep into air gaps, reducing volumes of air gaps.

At operation 136, the method 100 (FIG. 1B) removes the B-SAC layer 203 in an etching process. The resultant structure is shown in FIGS. 13A-13E according to an embodiment. In the illustrated embodiment, the removal of the B-SAC layer 203 exposes the gate stack 240 and results in gaps 333 between the dielectric liner 304 and the gate stack 240. The gaps 333 exist directly below the dielectric liner 304 and above the gate stack 240 and expose portions of the sidewalls of the S/D contact 282, the S/D capping layer 276, and the isolation structure 230. In various embodiments, a vertical distance d3 between the dielectric liner 304 and the gate stack 240 is in a range of about 0.5 nm to about 10 nm. In an embodiment, the etching process may include a plasma dry etching, a chemical dry etching, an ashing process, a wet etching, or other suitable etching methods. For example, the plasma dry etching process may use conventional dry etchant for dielectric material such as $C_4F_6$ mixed with $H_2$ or $O_2$, the chemical dry etching process may use one or more chemicals such as $H_2$, the ashing process may use oxygen or hydrogen ashing, and the wet etching process may apply a hot SPM solution (a mixture of sulfuric acid and hydrogen peroxide), for example, at a temperate above 100° C.

At operation 138, the method 100 (FIG. 1B) deposits a seal layer 312 over the backside of the device 200 and caps air gaps 314 vertically between the gate stack 240 and the seal layer 312. The resultant structure is shown in FIGS. 14A-14E according to an embodiment. The deposition of the seal layer 312 is also referred to as a capping process. As used herein, the term "air gap" is used to describe a void defined by surrounding substantive features, where a void may contain air, nitrogen, ambient gases, gaseous chemicals used in previous or current processes, or combinations thereof. The structure of the device 200 and the formation of the seal layer 312 is tuned to effectively close up the space horizontally between the S/D contact 282 and the S/D capping layer 276, resulting in the air gaps 314. Particularly, the protruding S/D contact 282 and S/D capping layer 276 function as pillars supporting the seal layer 312 formed thereon. As discussed above, the distance d4 between the S/D contact 282 and the S/D capping layer 276 is set in a range that facilitates the capping process. The dielectric liner 304 further narrows the opening in a top portion of the space between the S/D contact 282 and the S/D capping layer 276. Further, the dielectric liner 304 provides a landing pad for the accumulating of the deposited dielectric material. In some embodiments, the dielectric liner 304 has a hydrophilic property that is easier to accumulate dielectric material than metallic surfaces of the S/D contact 282. In some embodiments, the deposited dielectric material is easier to accumulate on the dielectric liner 304 due to covalent bonds between similar material compositions of the dielectric liner 304 and the depositing dielectric material (e.g., both have oxides). In some embodiments, the depositing material of the seal layer 312 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). In furtherance of the embodiments, the seal layer 312 and the dielectric liner 304 may have the same dielectric material composition. In some alternative embodiments, the seal layer 312 and the dielectric liner 304 may have different dielectric material compositions.

The seal layer 312 may be deposited by CVD, PVD, PE-CVD, coating process, or other suitable process. In an embodiment, the seal layer 312 is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains the air gap without filling up the space between the S/D contact 282 and the S/D capping layer 276. In the present embodiment, the PE-CVD process employs a setting with pressure less than about 0.75 torr and temperature higher than about 75° C. Hence, the dielectric material of the seal layer 312 may be deposited at the upper portion between the dielectric liner 304 to enclose the space between the S/D contact 282 and the S/D capping layer 276 without a significant amount being deposited in a lower portion of the space. Respective air gaps 314 can therefore be formed below the dielectric material of the seal layer 312 and above the gate stack 240 for a vertical thickness in a range of about 0.5 nm to about 10 nm. In some embodiments, if the air gaps 314 are too thin (such as less than 0.5 nm), it may not provide sufficient isolation between the gate stack 240 and a subsequently-formed backside metal wiring layer. In some embodiments, if the air gaps 314 are too thick (such as more than 10 nm), then the backside S/D contacts and vias would have to be long enough to accommodate the air gap thickness and the resistance thereof would be high, which may reduce circuit speed. The sidewalls of the S/D contact 282, the S/D capping layer 276, the isolation structure 230, and the dielectric liner 304 are exposed in the air gaps 314. The gaps 333 vertically between the dielectric liner 304 and the gate stack 240 also becomes part of the air gaps 314. A gas, such as a gas(es) used during the deposition of the dielectric material of the seal layer 312 or any other species that can diffuse into the air gaps 314, may be in the air gaps 314. The seal layer 312 extends laterally from the air gaps 314 to top surfaces of the S/D contact 282 and the S/D capping layer 276. The seal layer 312 also covers a top surface and a portion of the sidewalls of the dielectric liner 304.

At operation 140, the method 100 (FIG. 1B) performs a CMP process to the seal layer 312 to remove excessive dielectric materials from the surface of the S/D contact 282. The resultant structure is shown in FIGS. 15A-15E according to an embodiment. Since the seal layer 312 includes different materials from the S/D contact 282, the S/D contact 282 may act as a CMP stop when the device 200 is planarized by the CMP process. After the operation 140, air gaps 314 remains capped by the seal layer 312 and top surfaces of the S/D contact 282 and S/D capping layer 276 are exposed. After the operation 140, the remaining seal layer 312 interposes opposing dielectric liners 304. In some embodiments, after the operation 140, the remaining seal layer 312 has a thickness in a range from about 0.5 nm to about 10 nm.

Figure 16B:
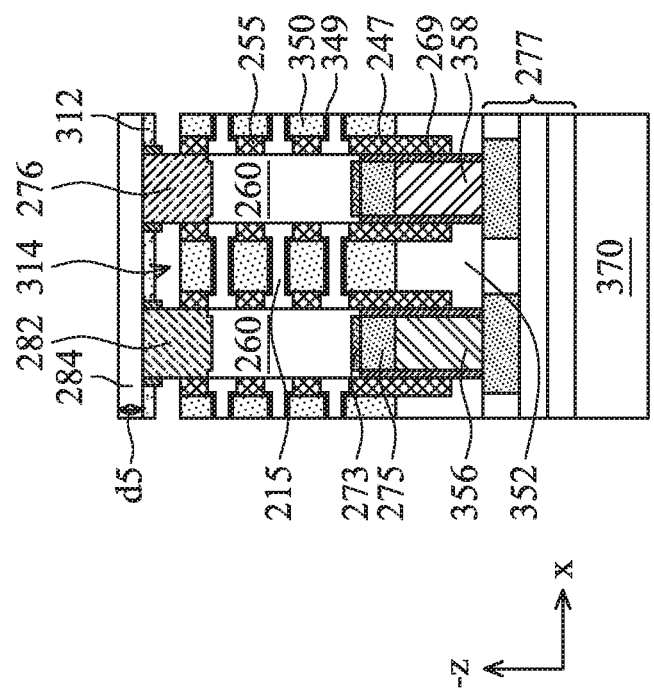
Figure 16A:
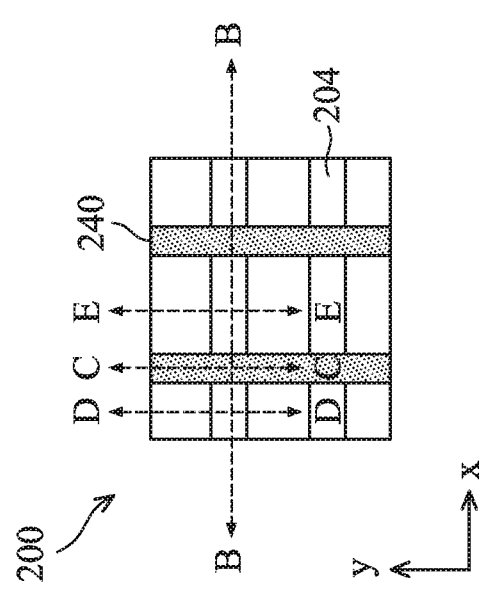
Figure 16D:
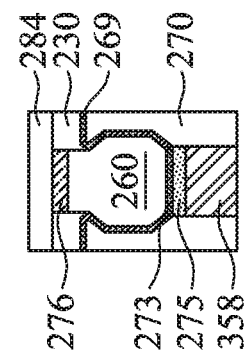
Figure 16E:
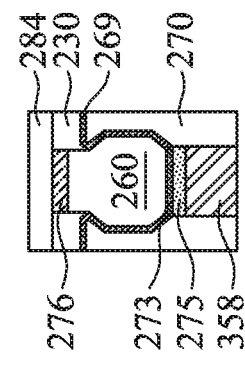
Figure 16C:
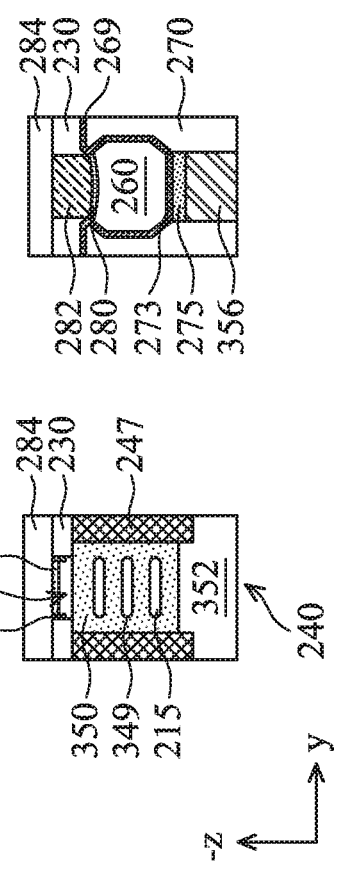
Figure 20B:
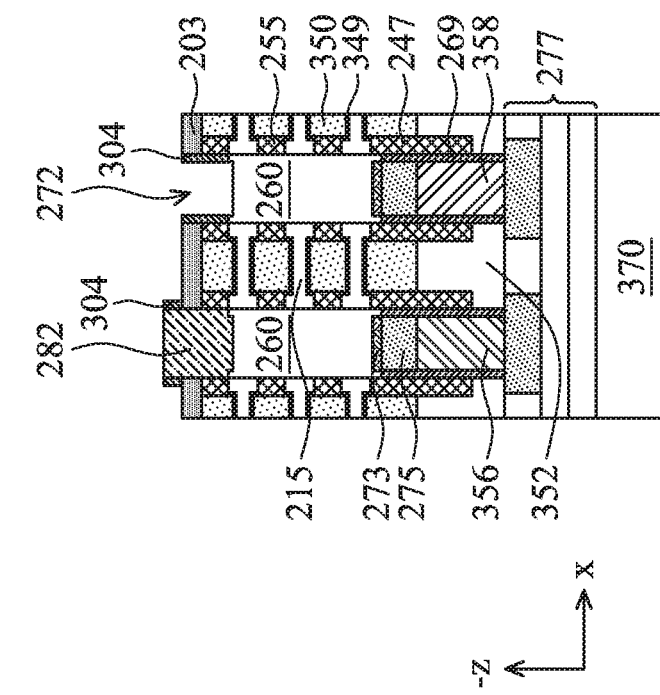
Figure 20E:
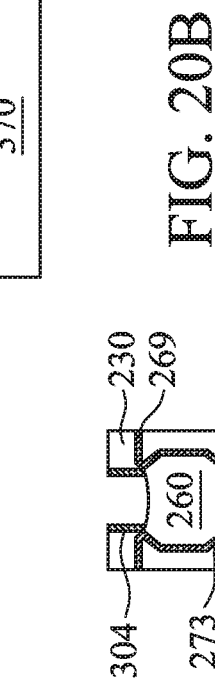
Figure 20D:
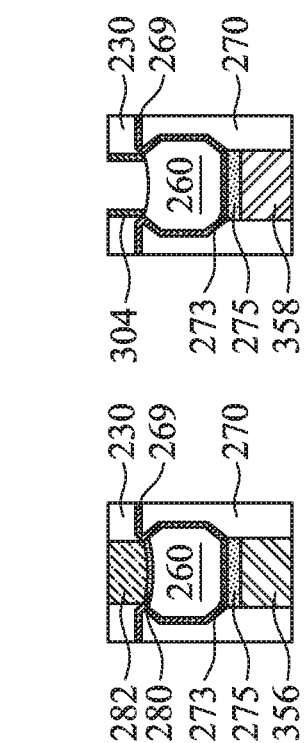
Figure 20A:
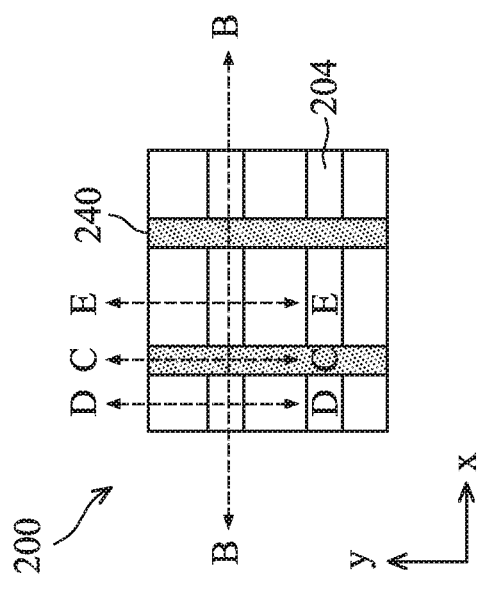
Figure 20C:
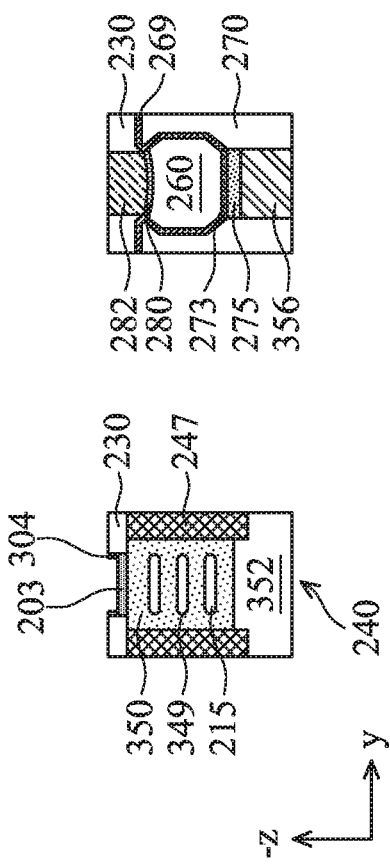

At operation 142, the method 100 (FIG. 1B) forms a metal wiring layer, such as backside power rails 284, on the backside of the device 200. The resultant structure is shown in FIGS. 16A-16E according to an embodiment. As illustrated in FIGS. 16B and 16D, the backside S/D contact 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIGS. 16A-16E, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance. In an embodiment, the backside power rails 284 may have a thickness d5 in a range from about 5 nm to about 40 nm.

At operation 144, the method 100 (FIG. 1B) performs further fabrication processes to the device 200. For example, it may form one or more interconnect layers on the backside of the device 200, form passivation layers on the backside of the device 200, perform other BEOL processes, and remove the carrier 370.

Figure 1C:
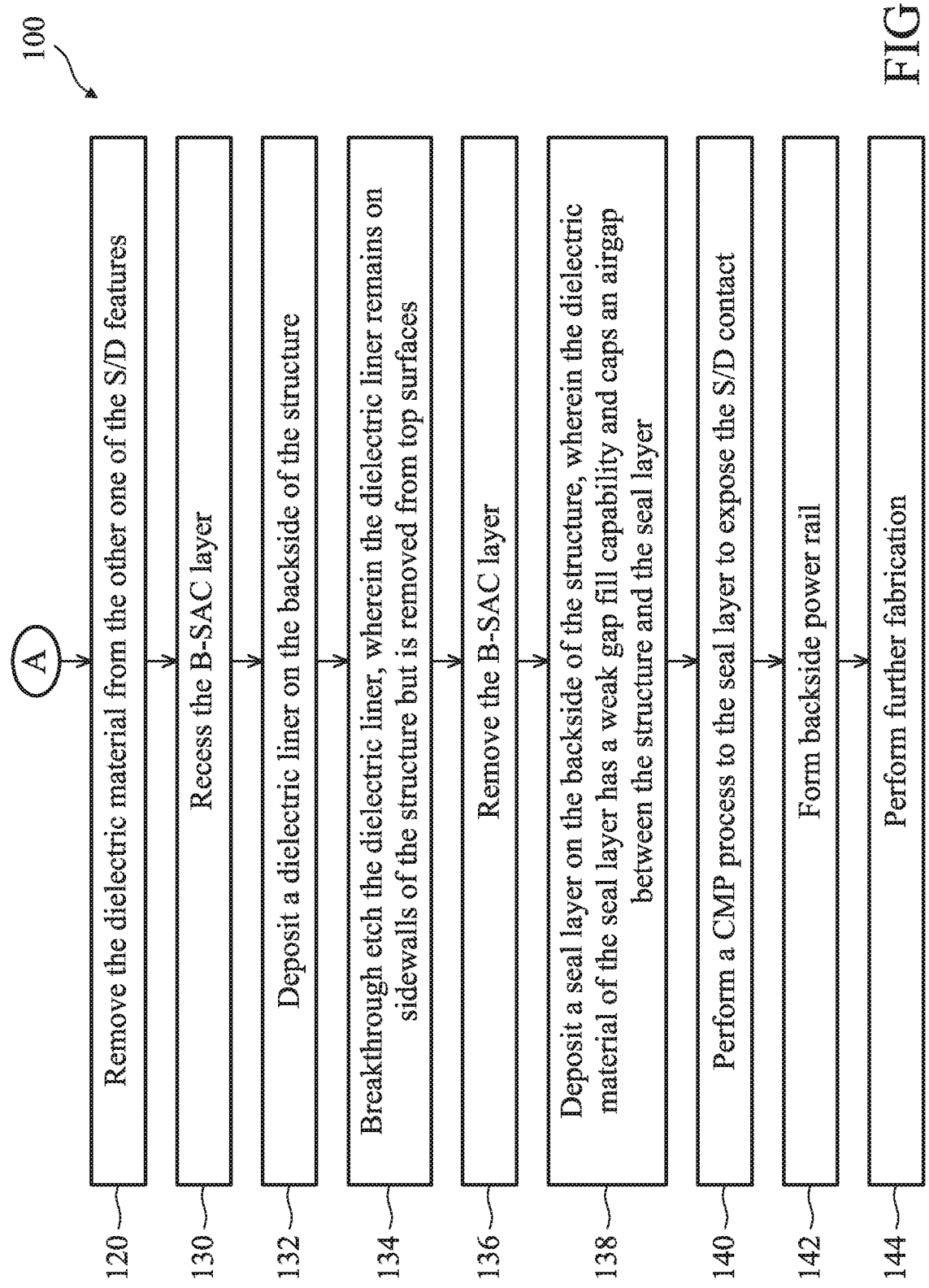

Reference is now made to FIG. 1C, which demonstrate an alternative embodiment of the method 100. In the alternative embodiment of the method 100, after the operation 118 (FIG. 1A) in which an CMP process exposes surfaces of the S/D contact 282, the S/D capping layer 276, and the B-SAC layer 203, the method 100 may optionally proceed to operation 120 (FIG. 1C) before proceeding to operation 130. The alternative embodiment of the method 100 is described below in conjunction with FIGS. 17A-24E, in which the manufacturing operations after the structure shown in FIGS. 9A-9E is formed are explained. Some aspects in the alternative embodiment of the method 100 are the same as what have been described above, and will be briefly discussed below.

At operation 120, the method 100 (FIG. 1C) removes the S/D capping layer 276 from above the drain feature 260 in an etching process. The resultant structure is shown in FIGS. 17A-17E according to an embodiment. The trench 272 above the drain feature 260 reappears after the removing of the S/D capping layer 276, exposing a surface of the drain feature 260 and sidewalls of the inner spacers 255. In the illustrated embodiment, the etching process also etches the drain feature 260 to recess it to a level that is even with or below the interface between the isolation structure 230 and the CESL 269 in order to enlarge the trench 272. As will be explained in further detail below, the trench 272 will become part of the air gaps and increase volumes of the air gaps, which beneficially further reduces coupling capacitance among different features in the device 200. In some embodiments, the operation 120 may apply more than one etching processes. For example, it may apply a first etching process to selectively remove the S/D capping layer 276, and then apply a second etching process to selectively recess the drain feature 260 to the desired level, where the first and the second etching processes use different etching parameters such as using different etchants. In an embodiment, the first etching process include a dry (plasma) etching process that is tuned to selectively etch the S/D capping layer 276 and with no (or minimal) etching to the isolation structure 230, the B-SAC layer 203, the inner spacers 255, and the source feature 260. In alternative embodiments, first etching process may use other types of etching (such as wet etching or reactive ion etching) as long as the etch selectivity between the layers is achieved as discussed above. Since the first etching process has no or minimal etching to the isolation structure 230, the B-SAC layer 203, and the inner spacers 255, the trench 272 is self-aligned to the drain feature 260 in the y-z plane and in the x-z plane, thereby improving the process margin. The second etching process can be dry etching, wet etching, reactive ion etching, or other suitable etching methods, to selectively recess the drain feature 260 to the desired level.

After the operation 120, the method 100 (FIG. 1C) proceeds to the operation 130 in selectively etching the B-SAC layer 203 to recess the B-SAC layer 203 below a surface of the S/D contact 282 and the isolation structure 230. The resultant structure is shown in FIGS. 18A-18E according to an embodiment. In the present embodiment, the operation 130 applies an etching process that is tuned to be selective to the dielectric materials of the B-SAC layer 203 and with no (or minimal) etching to the S/D contact 282, the inner spacers 255, the drain feature 260, and the isolation structure 230. The etching process can be a plasma dry etching, a chemical dry etching, an ashing process, a wet etching, or other suitable etching methods. As a result of the operation 130, portions of sidewalls of the S/D contact 282 and the isolation structure 230 are protruding from the B-SAC layer 203 for a distance d2. The distance d2 can be controlled by adjusting duration of the etching process. In some embodiments, the distance d2 is in a range of about 2 nm to about 20 nm.

At operation 132, the method 100 (FIG. 1C) deposits a dielectric liner 304 on the backside of the device 200. The resultant structure is shown in FIGS. 19A-19E according to an embodiment. In the illustrated embodiment, the dielectric liner 304 is conformally deposited to have a substantially uniform thickness along the various surfaces of the B-SAC layer 203, the isolation structure 230, the S/D contact 282, and the trench 272 including sidewalls of the inner spacers 255 and a top surface of the drain feature 260. In various embodiment, the dielectric liner 304 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). The dielectric liner 304 may be deposited using ALD, CVD, or other suitable methods, and may have a thickness of about 0.5 nm to about 10 nm (e.g., as measured on the sidewalls of the S/D contact 282 along the "x" direction) in various embodiments.

At operation 134, the method 100 (FIG. 1C) performs a BT etching process for breaking through, and removing the majority of, the horizontal portions of the dielectric liner 304. The resultant structure is shown in FIGS. 20A-20E. In some embodiments, the BT etching process may include an anisotropic dry etch process, or the like. In some embodiments where the dielectric liner 304 is formed of an oxide compound, the BT etching process is a reactive ion etch (RIE) process with etch process gases including $CHF_3$, Ar, $CF_4$, $N_2$, $O_2$, $CH_2F_2$, $SF_3$, the like, or a combination thereof. In the illustrated embodiment, as a result of the operation 134, portions of the dielectric liner 304 remain on sidewalls of the S/D contact 282, the trench 272, and the isolation structure 230. The portion of the dielectric liner 304 on sidewalls of the trench 272 is in contact with the drain feature 260.

At operation 136, the method 100 (FIG. 1C) removes the B-SAC layer 203 in an etching process. The resultant structure is shown in FIGS. 21A-21E according to an embodiment. In the illustrated embodiment, the removal of the B-SAC layer 203 exposes the gate stack 240 and results in gaps 333 between the dielectric liner 304 on sidewall of the S/D contact 282 and the gate stack 240. The gaps 333 exist directly below the dielectric liner 304 on sidewall of the S/D contact 282 and above the gate stack 240. In various embodiments, a vertical distance d3 between the dielectric liner 304 on sidewall of the S/D contact 282 and the gate stack 240 is in a range of about 0.5 nm to about 10 nm. Also due to the removal of the B-SAC layer 203, the dielectric liner 304 on sidewalls of the trench 272 protrudes from the gate stack 240. The protruding distance roughly equals d3. In other words, a terminal end of the dielectric liner 304 on sidewalls of the S/D contact 282 and a terminal end of the dielectric liner 304 on sidewalls of the trench 272 are level. In the y-z plane, the dielectric liner 304 remains covering sidewalls of the trench 272 and level with a top surface of the isolation structure 230, as shown in FIG. 21E. In an embodiment, the etching process may include a plasma dry etching, a chemical dry etching, an ashing process, a wet etching, or other suitable etching methods.

Figure 22A:
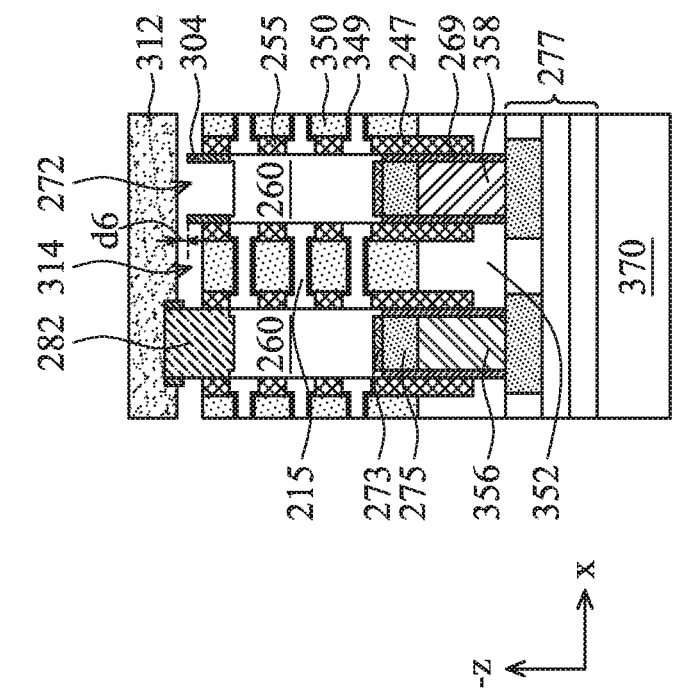
Figure 22B:
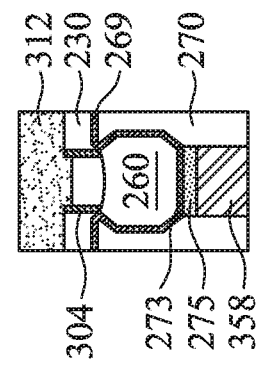
Figure 22C:
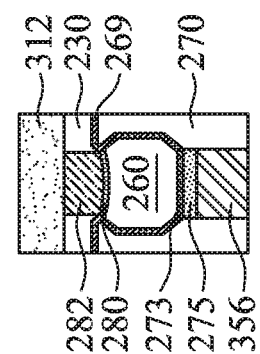
Figure 22D:
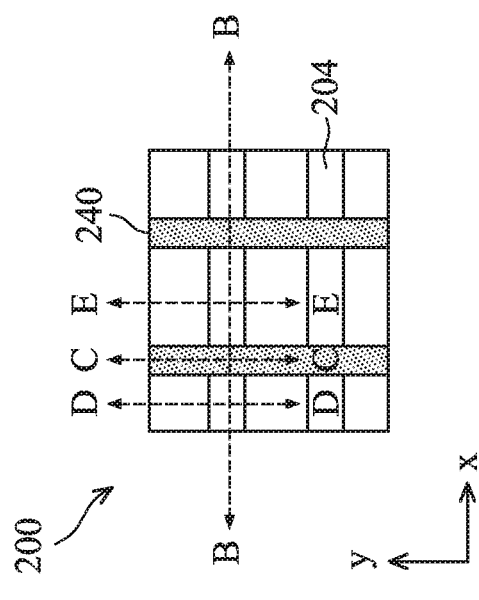
Figure 22E:
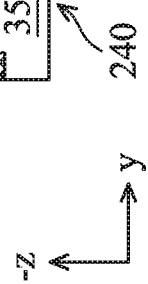
Figure 25B:
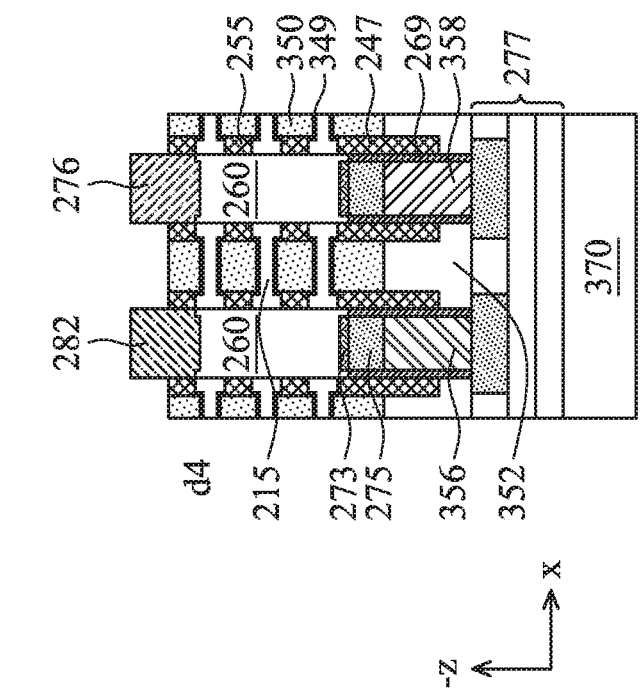
Figure 25E:
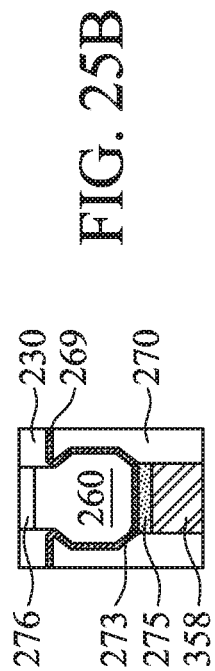
Figure 25D:
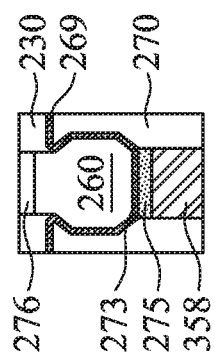
Figure 25A:
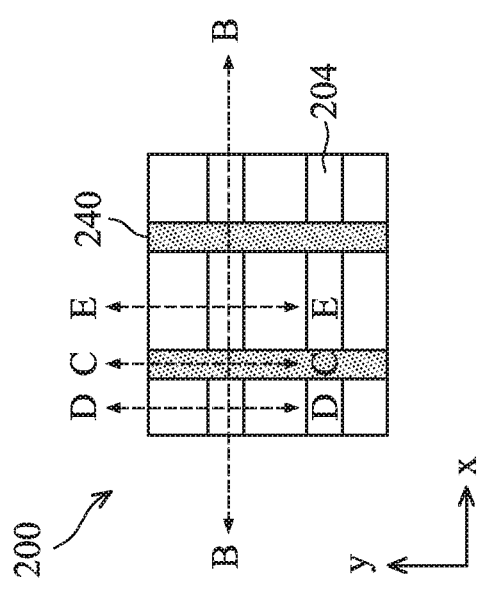
Figure 25C:
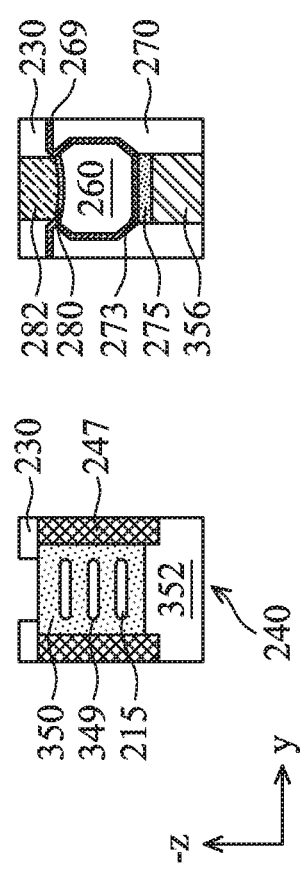
Figure 28A:
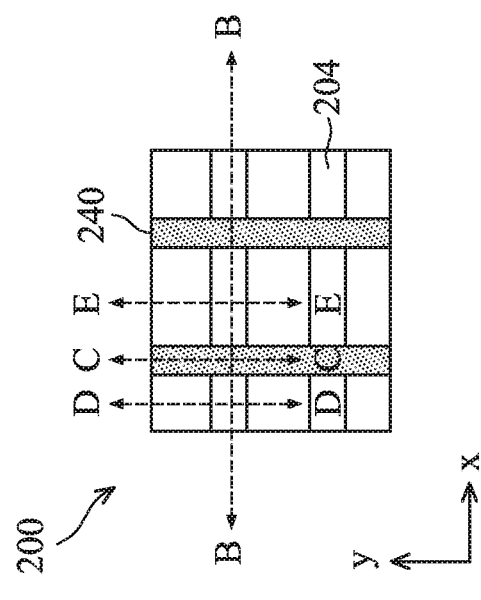
Figure 28C:
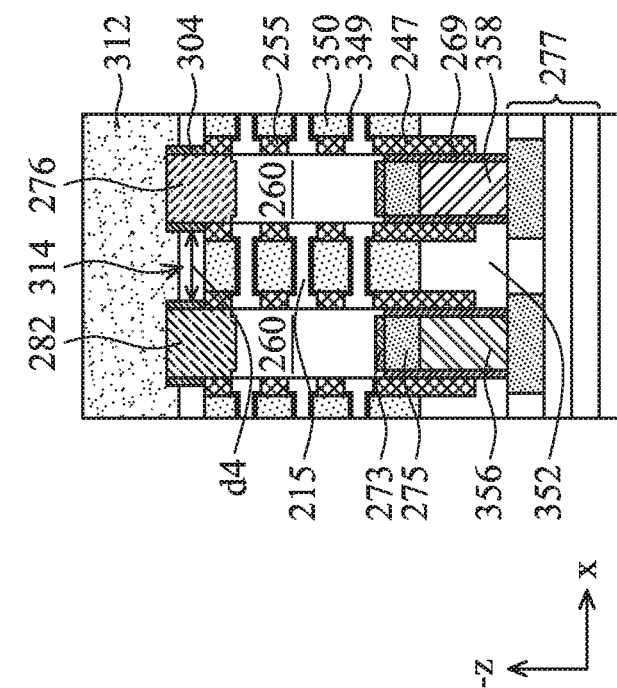
Figure 28D:
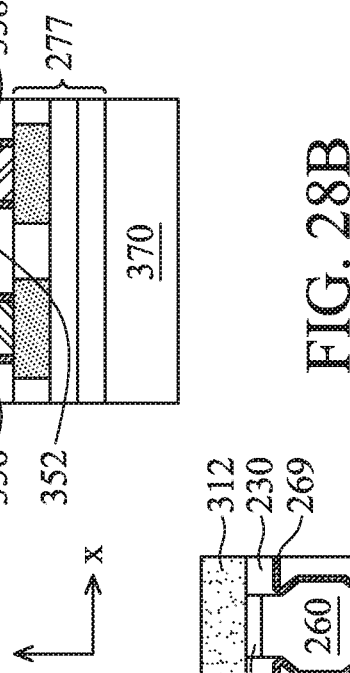
Figure 28E:
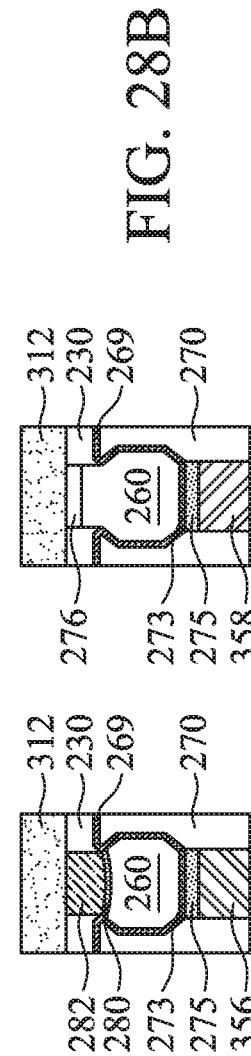
Figure 28B:
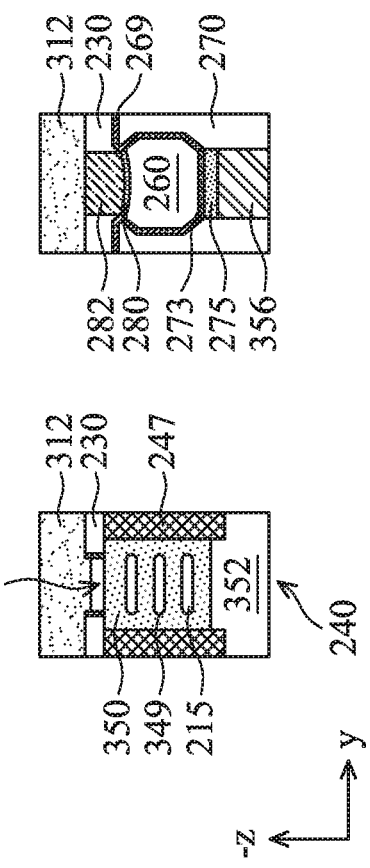
Figures 29A, 29B, 29C, 29D, 29E:
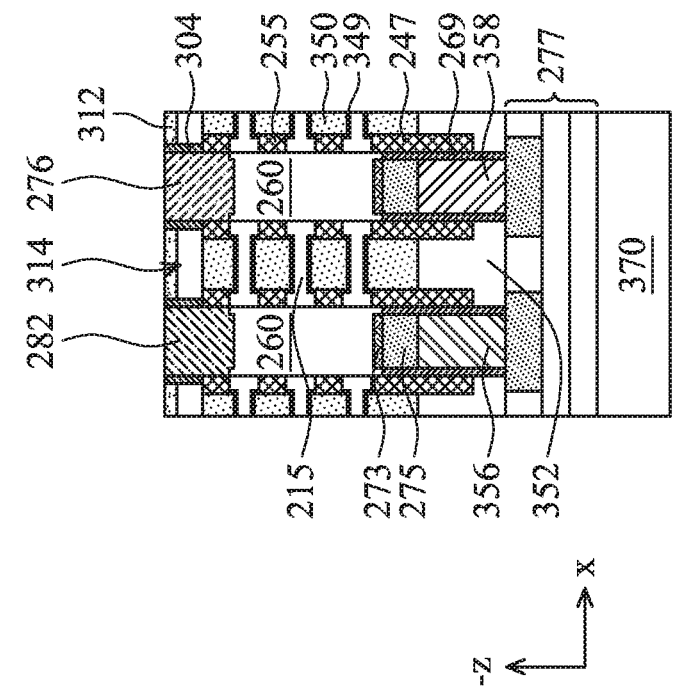

At operation 138, the method 100 (FIG. 1C) deposits a seal layer 312 over the backside of the device 200 and caps air gaps 314 vertically between the gate stack 240 and the seal layer 312. The resultant structure is shown in FIGS. 22A-22E according to an embodiment. The structure of the device 200 and the formation of the seal layer 312 is tuned to effectively close up the space horizontally between adjacent (or neighboring) S/D contacts 282, resulting in the air gaps 314. Particularly, the protruding neighboring S/D contacts 282 (one is shown in FIG. 22B) function as pillars supporting the seal layer 312 formed thereon. The distance between two neighboring S/D contacts 282 is set in a range that facilitates the capping process. The dielectric liner 304 further narrows the opening in a top portion of the space between two neighboring S/D contacts 282. Further, the dielectric liner 304 provides a landing pad for the accumulating of the depositing dielectric material. In some embodiments, the dielectric liner 304 has a hydrophilic property that is easier to accumulate dielectric material than metallic surfaces of the S/D contact 282. In some embodiments, the depositing dielectric material is easier to accumulate on the dielectric liner 304 due to covalent bonds between similar material compositions of the dielectric liner 304 and the depositing dielectric material (e.g., both have oxides). In some embodiments, the depositing material of the seal layer 312 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). In furtherance of the embodiments, the seal layer 312 and the dielectric liner 304 may have the same dielectric material composition.

The seal layer 312 may be deposited by CVD, PVD, PE-CVD, coating process, or other suitable process. In an embodiment, the seal layer 312 is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains the air gap without filling up the space between two neighboring S/D contacts 282. The sidewalls of the S/D contact 282, the isolation structure 230, and the dielectric liner 304 are exposed in the air gaps 314. The trench 272 becomes part of the air gaps 314, enlarging volume of the air gaps 314. The dielectric liner 304 on the sidewalls of the trench 272 is spaced away from the seal layer 312 for a distance d6, which is in a range of about 0.5 nm to about 10 nm in some embodiments. The distance d6 allows the trench 272 fluidly communicate with two neighboring air gaps 314, thereby forming a larger air gap that spans between two neighboring S/D contacts 282. A gas, such as a gas(es) used during the deposition of the dielectric material of the seal layer 312 or any other species that can diffuse into the air gaps 314, may be in the air gaps 314. The seal layer 312 extends laterally from the air gaps 314 to top surfaces of the S/D contact 282. The seal layer 312 also covers a top surface and a portion of the sidewall of the dielectric liner 304 that is deposited on the sidewalls of the S/D contact 282.

At operation 140, the method 100 (FIG. 1C) performs a CMP process to the seal layer 312 to remove excessive dielectric materials from the surface of the S/D contact 282. The resultant structure is shown in FIGS. 23A-23E according to an embodiment. Since the seal layer 312 includes different materials from the S/D contact 282 so that the S/D contact 282 may act as a CMP stop when the device 200 is planarized by the CMP process. After the operation 140, air gaps 314 remain capped by the seal layer 312 and backside surfaces of the S/D contacts 282 are exposed. After the operation 140, the remaining seal layer 312 interpose opposing dielectric liners 304 on sidewalls of two neighboring S/D contacts 282. In some embodiments, after the operation 140, the remaining seal layer 312 has a thickness in a range from about 0.5 nm to about 10 nm.

At operation 142, the method 100 (FIG. 1C) forms a metal wiring layer, such as backside power rails 284, on the backside of the device 200. The resultant structure is shown in FIGS. 24A-24E according to an embodiment. As illustrated in FIGS. 24B and 24D, the backside S/D contact 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. In an embodiment, the backside power rails 284 may have a thickness d5 in a range from about 5 nm to about 40 nm.

At operation 144, the method 100 (FIG. 1C) performs further fabrication processes to the device 200. For example, it may form one or more interconnect layers on the backside of the device 200, form passivation layers on the backside of the device 200, perform other BEOL processes, and remove the carrier 370.

Figure 1D:
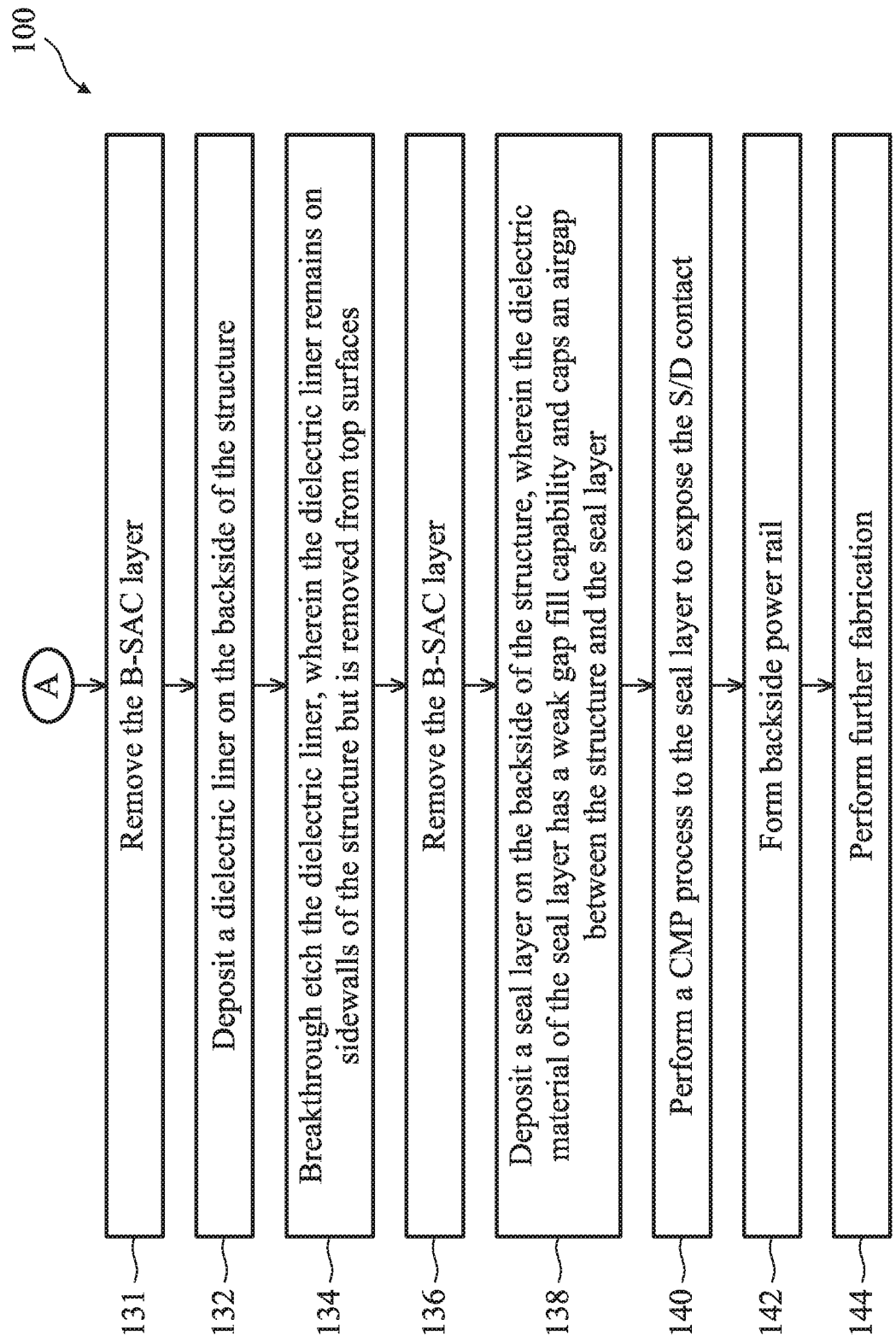

Reference is now made to FIG. 1D, which demonstrate yet another alternative embodiment of the method 100. In this second alternative embodiment of the method 100, after the operation 118 (FIG. 1A) in which an CMP process exposes surfaces of the S/D contact 282, the S/D capping layer 276, and the B-SAC layer 203, the method 100 may optionally proceed to operation 131 (FIG. 1D) before proceeding to operation 132 and skip operation 130. The second alternative embodiment of the method 100 is described below in conjunction with FIGS. 25A-30E, in which the manufacturing operations after the structure shown in FIGS. 9A-9E is formed are explained. Some aspects in the second alternative embodiment of the method 100 are the same as what have been described above, and will be briefly discussed below.

At operation 131, the method 100 (FIG. 1D) removes the B-SAC layer 203 in an etching process. The resultant structure is shown in FIGS. 25A-25E according to an embodiment. In the illustrated embodiment, the removal of the B-SAC layer 203 exposes a top surface of the gate stack 240 and sidewalls of the S/D contact 282 and the S/D capping layer 276. In an embodiment, the etching process may include a plasma dry etching, a chemical dry etching, an ashing process, a wet etching, or other suitable etching methods.

After the operation 131, the method 100 (FIG. 1D) proceeds to the operation 132 in depositing a dielectric liner 304 on the backside of the device 200. The resultant structure is shown in FIGS. 26A-26E according to an embodiment. In the illustrated embodiment, the dielectric liner 304 is conformally deposited to have a substantially uniform thickness along the various surfaces of the top surface of the gate stack 240 and the top and sidewall surfaces of the isolation structure 230, the S/D contact 282, and the S/D capping layer 276. In various embodiment, the dielectric liner 304 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). The dielectric liner 304 may be deposited using ALD, CVD, or other suitable methods, and may have a thickness of about 0.5 nm to about 10 nm (e.g., as measured on the sidewalls of the S/D contact 282 along the "x" direction) in various embodiments.

At operation 134, the method 100 (FIG. 1D) performs a BT etching process for breaking through, and removing the majority of, the horizontal portions of the dielectric liner 304. The resultant structure is shown in FIGS. 27A-27E. In some embodiments, the BT etching process may include an anisotropic dry etch process, or the like. In some embodiments where the dielectric liner 304 is formed of an oxide compound, the BT etching process is a reactive ion etch (RIE) process with etch process gases including $CHF_3$, Ar, $CF_4$, $N_2$, $O_2$, $CH_2F_2$, $SF_3$, the like, or a combination thereof. In the illustrated embodiment, as a result of the operation 134, portions of the dielectric liner 304 on sidewalls of the S/D contact 282, the S/D capping layer 276, and the isolation structure 230 remain, extending from a backside surface of the gate stack 240 (particularly from inner spacers 255) to top surfaces of the S/D contact 282, the S/D capping layer 276, and the isolation structure 230. A vertical length of the dielectric liner 304 is in a range of about 2 nm to about 10 nm in some embodiments.

At operation 138, the method 100 (FIG. 1D) deposits a seal layer 312 over the backside of the device 200 and caps air gaps 314 vertically between the gate stack 240 and the seal layer 312. The resultant structure is shown in FIGS. 28A-28E according to an embodiment. The structure of the device 200 and the formation of the seal layer 312 is tuned to effectively close up the space horizontally between the S/D contact 282 and the S/D capping layer 276, resulting in the air gaps 314. Particularly, the protruding S/D contact 282 and S/D capping layer 276 function as pillars supporting the seal layer 312 formed thereon. As discussed above, the distance d4 between the S/D contact 282 and the S/D capping layer 276 is set in a range that facilitates the capping process. The dielectric liner 304 further narrows the opening in a top portion of the space between the S/D contact 282 and the S/D capping layer 276. Further, the dielectric liner 304 provides a landing pad for the accumulating of the deposited dielectric material. In some embodiments, the dielectric liner 304 has a hydrophilic property that is easier to accumulate dielectric material than metallic surfaces of the S/D contact 282. In some embodiments, the deposited dielectric material is easier to accumulate on the dielectric liner 304 due to covalent bonds between similar material compositions of the dielectric liner 304 and the depositing dielectric material (e.g., both have oxides). In some embodiments, the depositing material of the seal layer 312 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). In furtherance of the embodiments, the seal layer 312 and the dielectric liner 304 may have the same dielectric material composition. In some alternative embodiments, the seal layer 312 and the dielectric liner 304 may have different dielectric material compositions.

The seal layer 312 may be deposited by CVD, PVD, PE-CVD, coating process, or other suitable process. In an embodiment, the seal layer 312 is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains the air gap without filling up the space between the S/D contact 282 and the S/D capping layer 276. Hence, the dielectric material of the seal layer 312 may be deposited at the upper portion between the dielectric liner 304 to enclose the space between the S/D contact 282 and the S/D capping layer 276 without a significant amount being deposited in a lower portion of the space. Respective air gaps 314 can therefore be formed below the dielectric material of the seal layer 312 and above the gate stack 240, and surrounded by sidewalls of the dielectric liner 304 which extends from the gate stack 240 into the seal layer 312. A gas, such as a gas(es) used during the deposition of the dielectric material of the seal layer 312 or any other species that can diffuse into the air gaps 314, may be in the air gaps 314. The seal layer 312 extends laterally from the air gaps 314 to top surfaces of the S/D contact 282 and the S/D capping layer 276. The seal layer 312 also covers a top surface and a portion of the sidewall of the dielectric liner 304.

At operation 140, the method 100 (FIG. 1D) performs a CMP process to the seal layer 312 to remove excessive dielectric materials from the surface of the S/D contact 282. The resultant structure is shown in FIGS. 29A-29E according to an embodiment. Since the seal layer 312 includes different materials from the S/D contact 282 so that the S/D contact 282 may act as a CMP stop when the device 200 is planarized by the CMP process. After the operation 140, air gaps 314 remains capped by the seal layer 312 and top surfaces of the S/D contact 282 and S/D capping layer 276 are exposed. After the operation 140, the remaining seal layer 312 interpose opposing dielectric liners 304. In some embodiments, after the operation 140, the remaining seal layer 312 has a thickness in a range from about 0.5 nm to about 10 nm.

At operation 142, the method 100 (FIG. 1D) forms a metal wiring layer, such as backside power rails 284, on the backside of the device 200. The resultant structure is shown in FIGS. 30A-30B according to an embodiment. As illustrated in FIGS. 30B and 30D, the backside S/D contact 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. In an embodiment, the backside power rails 284 may have a thickness d5 in a range from about 5 nm to about 40 nm.

At operation 144, the method 100 (FIG. 1C) performs further fabrication processes to the device 200. For example, it may form one or more interconnect layers on the backside of the device 200, form passivation layers on the backside of the device 200, perform other BEOL processes, and remove the carrier 370.

Although not intended to be limiting, embodiments of the present disclosure provide one or more of the following advantages. For example, embodiments of the present disclosure form air gaps sandwiched between gate stacks and backside wiring layers. This advantageously reduces the coupling capacitance in the device, which helps the circuit to operate faster. Also, embodiments of the present disclosure minimize the risk of leakage path between gate stacks and backside wiring layers. Further, embodiments of the present disclosure form backside wiring layers, such as backside power rails, to increase the number of metal tracks available in an integrated circuit and increase the gate density for greater device integration. Embodiments of the present disclosure can be readily integrated into existing semiconductor manufacturing processes.

In one example aspect, the present disclosure is directed to a method. The method includes providing a structure having a frontside and a backside, the structure including a substrate, a first dielectric layer over the substrate, one or more semiconductor channel layers over the first dielectric layer and connecting a first source/drain (S/D) feature and a second S/D feature, and a gate structure engaging the one or more semiconductor channel layers, wherein the substrate is at the backside of the structure and the gate structure is at the frontside of the structure; etching the substrate from the backside of the structure to form a first trench exposing the first S/D feature and a second trench exposing the second S/D feature; forming an S/D contact in the first trench; etching at least a portion of the first dielectric layer resulting in a portion of the S/D contact protruding from the first dielectric layer at the backside of the structure; and depositing a seal layer over the S/D contact, wherein the seal layer caps an air gap between the gate structure and the seal layer. In some embodiments, the method further includes forming a dielectric liner on sidewalls of the portion of the S/D contact, wherein the seal layer is in contact with the dielectric liner. In some embodiments, the etching of at least the portion of the first dielectric layer includes completely removing the first dielectric layer prior to the forming of the dielectric liner. In some embodiments, the forming of the dielectric liner includes conformally depositing the dielectric liner on the backside of the structure; and anisotropically etching the dielectric liner thereby removing the dielectric liner from a top surface of the S/D contact. In some embodiments, the method further includes depositing a second dielectric layer to fill the second trench, prior to the forming of the S/D contact in the first trench. In some embodiments, the method further includes etching the second dielectric layer to expose the second S/D feature, after the forming of the S/D contact in the first trench. In some embodiments, the method further includes thinning the seal layer, thereby exposing the S/D contact; and forming a metal wiring layer at the backside of the structure, wherein the metal wiring layer is in contact with the S/D contact. In some embodiments, the depositing of the seal layer includes a plasma-enhanced chemical vapor deposition (PE-CVD) process. In some embodiments, the air gap extends vertically from a surface of the gate structure to a surface of the sealing layer for a distance ranging from about 0.5 nm to about 10 nm.

In another example aspect, the present disclosure is directed to a method. The method includes providing a structure having a frontside and a backside, the structure including a substrate, a semiconductor fin over the substrate, a first source/drain (S/D) feature and a second S/D feature over the semiconductor fin, a dielectric capping layer over the semiconductor fin, one or more semiconductor channel layers over the dielectric capping layer and connecting the first and second S/D features, and a gate structure engaging the one or more semiconductor channel layers, wherein the substrate is at the backside of the structure and the gate structure is at the frontside of the structure; thinning down the structure from the backside of the structure until the semiconductor fin is exposed; etching the semiconductor fin from the backside of the structure to form a first trench exposing the first S/D feature and a second trench exposing the second S/D feature; depositing a dielectric layer in the second trench; forming an S/D contact in the first trench; recessing the dielectric capping layer from the backside of the structure, thereby exposing sidewalls of the S/D contact; forming a dielectric liner on the sidewalls of the S/D contact; depositing a seal layer over the S/D contact, resulting in an air gap sandwiched between the gate structure and the seal layer; and forming a metal wiring layer over the seal layer, wherein the metal wiring layer electrically couples to the S/D contact. In some embodiments, the recessing of the dielectric layer exposes a surface of the gate structure, prior to the forming of the dielectric liner. In some embodiments, the method further includes after the forming the dielectric liner, removing the dielectric capping layer, thereby creating a gap between the dielectric liner and the gate structure. In some embodiments, the recessing of the dielectric capping layer also exposes sidewalls of the dielectric layer, and wherein the forming of the dielectric liner includes forming the dielectric liner on the sidewalls of the dielectric layer. In some embodiments, the method further includes etching the dielectric layer to expose a surface of the second S/D feature and sidewalls of the dielectric capping layer, prior to the forming of the dielectric liner, wherein the forming of the dielectric liner includes forming the dielectric liner on the sidewalls of the dielectric capping layer. In some embodiments, the air gap extends vertically from the surface of the second S/D feature to a surface of the seal layer. In some embodiments, the method further includes thinning the seal layer to expose the S/D contact, prior to the forming of the metal wiring layer.

In yet another example aspect, the present disclosure is directed to a semiconductor structure. The semiconductor structure includes first and second source/drain (S/D) features; one or more channel semiconductor layers connecting the first and second S/D features; a gate structure engaging the one or more channel semiconductor layers, wherein the first and second S/D features, the one or more channel semiconductor layer, and the gate structure are at a frontside of the semiconductor structure; a metal wiring layer at a backside of the semiconductor structure; and a seal layer between the metal wiring layer and the gate structure, wherein the seal layer is spaced away from the gate structure by an air gap therebetween. In some embodiments, the semiconductor structure further includes an S/D contact electrically coupling to the first S/D feature; and a dielectric liner on sidewalls of the S/D contact, wherein the dielectric liner is in contact with the seal layer. In some embodiments, the dielectric liner is spaced away from the gate structure by the air gap. In some embodiments, the semiconductor structure further includes a dielectric liner extending from a surface of the second S/D feature towards the seal layer, wherein the dielectric liner is spaced away from the seal layer by the air gap.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure having a frontside and a backside, the structure including a substrate, a first dielectric layer over the substrate, one or more semiconductor channel layers over the first dielectric layer and connecting a first source/drain (S/D) feature and a second S/D feature, and a gate structure engaging the one or more semiconductor channel layers, wherein the substrate is at the backside of the structure and the gate structure is at the frontside of the structure;
   etching the substrate from the backside of the structure to form a first trench exposing the first S/D feature and a second trench exposing the second S/D feature;
   forming an S/D contact in the first trench;
   etching at least a portion of the first dielectric layer resulting in a portion of the S/D contact protruding from the first dielectric layer at the backside of the structure; and
   depositing a seal layer over the S/D contact, wherein the seal layer caps an air gap between the gate structure and the seal layer.

2. The method of claim 1, further comprising:
   forming a dielectric liner on sidewalls of the portion of the S/D contact, wherein the seal layer is in contact with the dielectric liner.

3. The method of claim 2, wherein the etching of at least the portion of the first dielectric layer includes completely removing the first dielectric layer prior to the forming of the dielectric liner.

4. The method of claim 2, wherein the forming of the dielectric liner includes:
   conformally depositing the dielectric liner on the backside of the structure; and
   anisotropically etching the dielectric liner thereby removing the dielectric liner from a top surface of the S/D contact.

5. The method of claim 1, further comprising:
depositing a second dielectric layer to fill the second trench, prior to the forming of the S/D contact in the first trench.

6. The method of claim 5, further comprising:
etching the second dielectric layer to expose the second S/D feature, after the forming of the S/D contact in the first trench.

7. The method of claim 1, further comprising:
thinning the seal layer, thereby exposing the S/D contact; and
forming a metal wiring layer at the backside of the structure, wherein the metal wiring layer is in contact with the S/D contact.

8. The method of claim 1, wherein the depositing of the seal layer includes a plasma-enhanced chemical vapor deposition (PE-CVD) process.

9. The method of claim 1, wherein the air gap extends vertically from a surface of the gate structure to a surface of the sealing layer for a distance ranging from about 0.5 nm to about 10 nm.

10. A method, comprising:
providing a structure having a frontside and a backside, the structure including a substrate, a semiconductor fin over the substrate, a first source/drain (S/D) feature and a second S/D feature over the semiconductor fin, a dielectric capping layer over the semiconductor fin, one or more semiconductor channel layers over the dielectric capping layer and connecting the first and second S/D features, and a gate structure engaging the one or more semiconductor channel layers, wherein the substrate is at the backside of the structure and the gate structure is at the frontside of the structure;
thinning down the structure from the backside of the structure until the semiconductor fin is exposed;
etching the semiconductor fin from the backside of the structure to form a first trench exposing the first S/D feature and a second trench exposing the second S/D feature;
depositing a dielectric layer in the second trench;
forming an S/D contact in the first trench;
recessing the dielectric capping layer from the backside of the structure, thereby exposing sidewalls of the S/D contact;
forming a dielectric liner on the sidewalls of the S/D contact;
depositing a seal layer over the S/D contact, resulting in an air gap sandwiched between the gate structure and the seal layer; and
forming a metal wiring layer over the seal layer, wherein the metal wiring layer electrically couples to the S/D contact.

11. The method of claim 10, wherein the recessing of the dielectric capping layer exposes a surface of the gate structure, prior to the forming of the dielectric liner.

12. The method of claim 10, further comprising:
after the forming the dielectric liner, removing the dielectric capping layer, thereby creating a gap between the dielectric liner and the gate structure.

13. The method of claim 10, wherein the recessing of the dielectric capping layer also exposes sidewalls of the dielectric layer, and wherein the forming of the dielectric liner includes forming the dielectric liner on the sidewalls of the dielectric layer.

14. The method of claim 10, further comprising:
etching the dielectric layer to expose a surface of the second S/D feature and sidewalls of the dielectric capping layer, prior to the forming of the dielectric liner,
wherein the forming of the dielectric liner includes forming the dielectric liner on the sidewalls of the dielectric capping layer.

15. The method of claim 14, wherein the air gap extends vertically from the surface of the second S/D feature to a surface of the seal layer.

16. The method of claim 10, further comprising:
thinning the seal layer to expose the S/D contact, prior to the forming of the metal wiring layer.

17. A method, comprising:
providing a structure having a frontside and a backside, the structure including a substrate, a semiconductor fin over the substrate, a source/drain (S/D) feature over the semiconductor fin, a dielectric capping layer over the semiconductor fin, one or more semiconductor channel layers over the dielectric capping layer and abutting the S/D feature, and a gate structure engaging the one or more semiconductor channel layers, wherein the substrate is at the backside of the structure and the gate structure is at the frontside of the structure;
thinning down the structure from the backside of the structure until the semiconductor fin is exposed;
etching the semiconductor fin from the backside of the structure to form a trench exposing the S/D feature;
forming an S/D contact in the trench;
recessing the dielectric capping layer from the backside of the structure, thereby exposing sidewalls of the S/D contact; and
depositing a seal layer over the S/D contact, resulting in an air gap sandwiched between the gate structure and the seal layer.

18. The method of claim 17, further comprising:
thinning the seal layer to expose the S/D contact; and
forming a metal wiring layer over the seal layer, wherein the metal wiring layer electrically couples to the S/D contact.

19. The method of claim 17, wherein the recessing of the dielectric capping layer fully removes the dielectric capping layer from the backside of the structure.

20. The method of claim 17, further comprising:
after the recessing of the dielectric capping layer, depositing a dielectric liner on sidewalls of the S/D contact,
wherein after the depositing of the seal layer, a portion of the dielectric liner is laterally stacked between the S/D contact and the seal layer.

\* \* \* \* \*